(12) United States Patent
Chun et al.

(10) Patent No.: US 9,553,235 B2
(45) Date of Patent: Jan. 24, 2017

(54) SEMICONDUCTOR LIGHT EMITTING DEVICE AND MANUFACTURING METHOD THEREOF

(71) Applicant: SAMSUNG ELECTRONICS CO., LTD., Suwon-si, Gyeonggi-do (KR)

(72) Inventors: Dae Myung Chun, Hwaseong-si (KR); Ji Hye Yeon, Cheongju-si (KR); Jae Hyeok Heo, Suwon-si (KR); Hyun Seong Kum, Yongin-si (KR); Han Kyu Seong, Seoul (KR); Young Jin Choi, Seoul (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/627,721

(22) Filed: Feb. 20, 2015

(65) Prior Publication Data
US 2016/0013365 A1    Jan. 14, 2016

(30) Foreign Application Priority Data
Jul. 11, 2014   (KR) .................. 10-2014-0087465

(51) Int. Cl.
| H01L 21/00 | (2006.01) |
| H01L 33/24 | (2010.01) |
| H01L 33/00 | (2010.01) |
| H01L 33/08 | (2010.01) |

(52) U.S. Cl.
CPC ............. *H01L 33/24* (2013.01); *H01L 33/007* (2013.01); *H01L 33/08* (2013.01)

(58) Field of Classification Search
CPC ........... H01L 33/62; H01L 33/08; H01L 33/24
See application file for complete search history.

(56) References Cited

U.S. PATENT DOCUMENTS

| 6,372,608 B1 | 4/2002 | Shimoda et al. |
| 6,645,830 B2 | 11/2003 | Shimoda et al. |
| RE38,466 E | 3/2004 | Inoue et al. |
| (Continued) | | |

FOREIGN PATENT DOCUMENTS

| JP | 2007-027298 A | 2/2007 |
| JP | 2009-009977 A | 1/2009 |
| (Continued) | | |

*Primary Examiner* — Zandra Smith
*Assistant Examiner* — Andre' C Stevenson
(74) *Attorney, Agent, or Firm* — Lee & Morse, P.C.

(57) ABSTRACT

A method for manufacturing a semiconductor light emitting device may include steps of forming a mask layer and a mold layer having a plurality of openings exposing portions of a base layer, forming a plurality of first conductivity-type semiconductor cores each including a body portion extending through each of the openings from the base layer and a tip portion disposed on the body portion and having a conical shape, and forming an active layer and a second conductivity-type semiconductor layer on each of the plurality of first conductivity-type semiconductor cores. The step of forming the plurality of first conductivity-type semiconductor cores may include forming a first region such that a vertex of the tip portion is positioned on a central vertical axis of the body portion, removing the mold layer, and forming an additional growth region on the first region such that the body portion has a hexagonal prism shape.

9 Claims, 25 Drawing Sheets

(56) References Cited

U.S. PATENT DOCUMENTS

| | | |
|---|---|---|
| 6,818,465 B2 | 11/2004 | Biwa et al. |
| 6,818,530 B2 | 11/2004 | Shimoda et al. |
| 6,858,081 B2 | 2/2005 | Biwa et al. |
| 6,967,353 B2 | 11/2005 | Suzuki et al. |
| 7,002,182 B2 | 2/2006 | Okuyama et al. |
| 7,084,420 B2 | 8/2006 | Kim et al. |
| 7,087,932 B2 | 8/2006 | Okuyama et al. |
| 7,154,124 B2 | 12/2006 | Han et al. |
| 7,208,725 B2 | 4/2007 | Sherrer et al. |
| 7,288,758 B2 | 10/2007 | Sherrer et al. |
| 7,319,044 B2 | 1/2008 | Han et al. |
| 7,501,656 B2 | 3/2009 | Han et al. |
| 7,709,857 B2 | 5/2010 | Kim et al. |
| 7,759,140 B2 | 7/2010 | Lee et al. |
| 7,781,727 B2 | 8/2010 | Sherrer et al. |
| 7,790,482 B2 | 9/2010 | Han et al. |
| 7,940,350 B2 | 5/2011 | Jeong |
| 7,959,312 B2 | 6/2011 | Yoo et al. |
| 7,964,881 B2 | 6/2011 | Choi et al. |
| 7,985,976 B2 | 7/2011 | Choi et al. |
| 7,994,525 B2 | 8/2011 | Lee et al. |
| 8,008,683 B2 | 8/2011 | Choi et al. |
| 8,013,352 B2 | 9/2011 | Lee et al. |
| 8,049,161 B2 | 11/2011 | Sherrer et al. |
| 8,129,711 B2 | 3/2012 | Kang et al. |
| 8,179,938 B2 | 5/2012 | Kim |
| 8,263,987 B2 | 9/2012 | Choi et al. |
| 8,324,646 B2 | 12/2012 | Lee et al. |
| 8,399,944 B2 | 3/2013 | Kwak et al. |
| 8,432,511 B2 | 4/2013 | Jeong |
| 8,455,284 B2 | 6/2013 | Seong et al. |
| 8,455,857 B2 | 6/2013 | Samuelson et al. |
| 8,459,832 B2 | 6/2013 | Kim |
| 8,502,242 B2 | 8/2013 | Kim |
| 8,536,604 B2 | 9/2013 | Kwak et al. |
| 8,735,931 B2 | 5/2014 | Han et al. |
| 8,766,295 B2 | 7/2014 | Kim |
| 2011/0140072 A1 | 6/2011 | Varangis et al. |
| 2011/0227037 A1* | 9/2011 | Su .................. C23C 16/0227 257/13 |
| 2013/0027623 A1* | 1/2013 | Negishi ............. H01L 25/0753 349/42 |
| 2013/0099199 A1 | 4/2013 | Cha et al. |
| 2013/0175501 A1 | 7/2013 | Hersee et al. |
| 2013/0221322 A1 | 8/2013 | Ohlsson |
| 2016/0035941 A1* | 2/2016 | Herner .................. H01L 33/08 257/13 |

FOREIGN PATENT DOCUMENTS

| | | |
|---|---|---|
| JP | 2013-254876 A | 12/2013 |
| KR | 10-0659897 B1 | 12/2006 |
| KR | 10-1258583 B1 | 5/2013 |

* cited by examiner

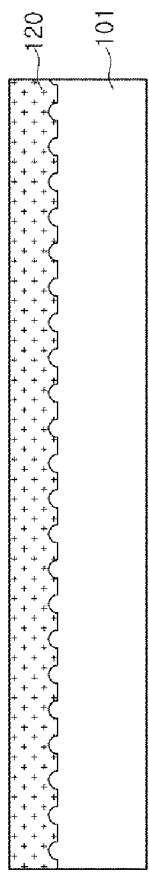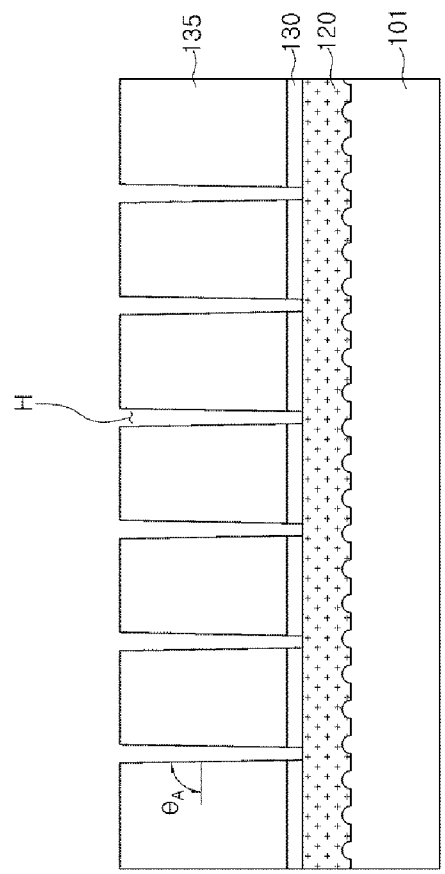

SEMICONDUCTOR LIGHT EMITTING DEVICE AND MANUFACTURING METHOD THEREOF

CROSS-REFERENCE TO RELATED APPLICATION

This application claims priority to Korean Patent Application No. 10-2014-0087465 filed on Jul. 11, 2014, with the Korean Intellectual Property Office, the entire disclosure of which is incorporated herein by reference.

BACKGROUND OF THE INVENTION

The present inventive concept relates to a semiconductor light emitting device and a method for manufacturing a semiconductor light emitting device.

Light Emitting Diodes (LEDs) have many advantages as compared to related art light sources, such as relatively long lifespans, low degrees of power consumption, rapid response speeds, environmental friendliness, and the like, and have thus been widely seen as next generation lighting sources and have come to prominence as an important type of light source for use in various products, such as general lighting devices and in the backlights of display devices. In particular, LEDs based on Group III nitrides, such as GaN, AlGaN, InGaN, InAlGaN, and the like, commonly serve as semiconductor light emitting devices outputting blue or ultraviolet light.

Recently, as LEDs have come into widespread use, the utilization thereof has extended to the light sources of devices for use in high current and high output applications. Demand for LEDs of devices for use in high current and high output applications has spurred ongoing research into improvements in light emitting characteristics in the art. In particular, in order to increase luminous efficiency through enhancements in crystallinity and increases in light emitting areas, semiconductor light emitting devices having light emitting nanostructures and manufacturing techniques therefor have been proposed.

SUMMARY OF THE INVENTION

An aspect of the present inventive concept may provide a semiconductor light emitting device having enhanced luminous efficiency.

According to an aspect of the present inventive concept, a semiconductor light emitting device may include: a base layer formed of a first conductivity-type semiconductor; a mask layer disposed on the base layer and having a plurality of openings exposing portions of the base layer; and a plurality of light emitting nanostructures disposed in the openings and including a first conductivity-type semiconductor core, an active layer, and a second conductivity-type semiconductor layer, respectively. Each of the plurality of light emitting nanostructures includes a body portion disposed on the mask layer and having a columnar shape and a tip portion disposed on the body portion and having a conical shape, and a percentage by which a vertex of the tip portion of each of the plurality of light emitting nanostructures is disposed within a distance equal to 1.5% of the width of the body portion from a central vertical axis of the body portion is 60% or greater.

The vertex may be disposed within 90 nm of the central vertical axis of the body portion.

The body portion may have a hexagonal prism shape and the tip portion may have a hexagonal pyramid shape.

The body portion may have crystal planes as m planes and the tip portion may have crystal planes as r planes.

The first conductivity-type semiconductor core may include a region having an impurity concentration higher than those of neighboring regions.

Each of the plurality of light emitting nanostructures may further include a highly resistive layer disposed to be in contact with the active layer in the tip portion.

The semiconductor light emitting device may further include a transparent electrode layer positioned on the second conductivity-type semiconductor layer.

According to another aspect of the present inventive concept, a semiconductor light emitting device may include: a base layer formed of a first conductivity-type semiconductor; a mask layer disposed on the base layer and having a plurality of openings exposing portions of the base layer; and a plurality of light emitting nanostructures disposed in the openings and including a first conductivity-type semiconductor core, an active layer, and a second conductivity-type semiconductor layer, respectively. Each of the plurality of light emitting nanostructures includes a body portion disposed on the mask layer and having a hexagonal prism shape and a tip portion disposed on the body portion and having a hexagonal pyramid shape, and the first conductivity-type semiconductor core includes a region having an impurity concentration higher than those of neighboring regions.

The first conductivity-type semiconductor core may include first to fourth regions sequentially disposed from the center thereof, and an impurity concentration of the third region may be higher than those of the second and fourth regions.

The first and second regions of the body portion may have sloped lateral surfaces.

The third region may be thicker in a lower portion of the body portion than in an upper portion of the body portion.

The impurity may be silicon (Si).

A percentage by which a vertex of the tip portion of each of the plurality of light emitting nanostructures is disposed within a distance equal to 1.5% of the width of the body portion from a central vertical axis of the body portion may be 60% or greater.

According to another aspect of the present inventive concept, a method for manufacturing a semiconductor light emitting device may include: forming a base layer with a first conductivity-type semiconductor on a substrate; forming a mask layer and a mold layer having a plurality of openings exposing portions of the base layer on the base layer; forming a plurality of first conductivity-type semiconductor cores each including a body portion extending through each of the openings from the base layer and a tip portion disposed on the body portion and having a conical shape; and sequentially forming an active layer and a second conductivity-type semiconductor layer on each of the plurality of first conductivity-type semiconductor cores. The forming of a plurality of first conductivity-type semiconductor cores includes: forming a first region such that a vertex of the tip portion is positioned on a central vertical axis of the body portion; removing the mold layer; and forming an additional growth region on the first region such that the body portion has a hexagonal prism shape.

The first region of the body portion may have sloped lateral surfaces.

In the forming of the additional growth region, the body portion may be mainly grown from a lower portion of the body portion to allow the body portion to be substantially perpendicular with respect to the substrate.

The plurality of first conductivity-type semiconductor cores may be formed of a gallium nitride (GaN)-based material, and in the forming of the first region, a ratio of a supplied gallium (Ga) precursor to a nitrogen (N) precursor may range from 1.4 to 2.0 and a process temperature may range from 900° C. to 1000° C.

The first region may fill each opening and extend to an upper portion of the mold layer to have a width greater than that of each opening on the mold layer.

The forming of the additional growth region may include growing a plurality of first conductivity-type semiconductor cores under a hydrogen ($H_2$) atmosphere.

The method may further include: growing the plurality of first conductivity-type semiconductor cores under a nitrogen ($N_2$) atmosphere, before growing the plurality of first conductivity-type semiconductor cores under the hydrogen ($H_2$) atmosphere.

The method may further include: growing the plurality of first conductivity-type semiconductor cores under a nitrogen ($N_2$) atmosphere, before and after growing the plurality of first conductivity-type semiconductor cores under the hydrogen ($H_2$) atmosphere.

The additional growth region may include a second region formed on the first region and grown under the nitrogen ($N_2$) atmosphere, a third region positioned on the second region and grown under hydrogen ($H_2$) atmosphere, and a fourth region positioned on the third region and grown under the nitrogen ($N_2$) atmosphere, and the third region may be thicker in a lower portion of the body portion than in an upper portion of the body portion.

An impurity concentration of the third region may be higher than those of the second and fourth regions.

An amount of an impurity source supplied to form the third region may be five times to seven times an amount of an impurity source supplied to form the second and fourth regions.

A percentage by which a vertex of the tip portion is disposed within a distance equal to 1.5% of the width of the body portion from a central vertical axis of the body portion may be 60% or greater.

According to another aspect of the present inventive concept, a method for manufacturing a semiconductor light emitting device may include steps of forming a plurality of first conductivity-type semiconductor cores on a base layer, each first conductivity-type semiconductor core including a body portion protruding from the base layer and a tip portion disposed on the body portion and having a conical shape and sequentially forming an active layer and a second conductivity-type semiconductor layer on each of the plurality of first conductivity-type semiconductor cores. The step of forming the plurality of first conductivity-type semiconductor cores may include steps of forming first regions of the plurality of first conductivity-type semiconductor cores in a first gas atmosphere at a first temperature, forming second regions of the plurality of first conductivity-type semiconductor cores on the first regions of the plurality of first conductivity-type semiconductor cores in a second gas atmosphere at a second temperature and forming third regions of the plurality of first conductivity-type semiconductor cores on the second regions of the plurality of first conductivity-type semiconductor cores in a third gas atmosphere at a third temperature. A pressure of the third gas atmosphere may be less than a pressure of the second gas atmosphere.

The plurality of first conductivity-type semiconductor cores may be formed of a gallium nitride (GaN)-based material, and in the step of forming the first regions, a ratio of a supplied gallium (Ga) precursor to a nitrogen (N) precursor may range from 1.4 to 2.0 and the first temperature may range from 900° C. to 1000° C.

The second temperature may be lower than the third temperature.

The second temperature may be within a range of 950° C. to 1050° C. and the third temperature may be within a range of 1050° C. to 1150° C.

The second gas atmosphere may be a nitrogen ($N_2$) atmosphere and the third gas atmosphere is a hydrogen ($H_2$) atmosphere.

The step of forming the plurality of first conductivity-type semiconductor cores may further include a step of forming fourth regions of the plurality of first conductivity-type semiconductor cores on the third regions of the plurality of first conductivity-type semiconductor cores in a fourth gas atmosphere at a fourth temperature. The fourth gas atmosphere may be identical to the second gas atmosphere and the fourth temperature may be identical to the second temperature.

A percentage by which a vertex of the tip portion is disposed within a distance equal to 1.5% of the width of the body portion from a central vertical axis of the body portion may be 60% or greater.

An amount of an impurity source supplied to form the third region may be five times to seven times an amount of an impurity source supplied to form the second region.

BRIEF DESCRIPTION OF DRAWINGS

The above and other aspects, features and other advantages of the present inventive concept will be more clearly understood from the following detailed description taken in conjunction with the accompanying drawings, in which:

FIGS. 2A through 2I are cross-sectional views schematically illustrating a method of manufacturing a semiconductor light emitting device according to an exemplary embodiment of the present invention;

DETAILED DESCRIPTION OF THE INVENTION

Figure 1:
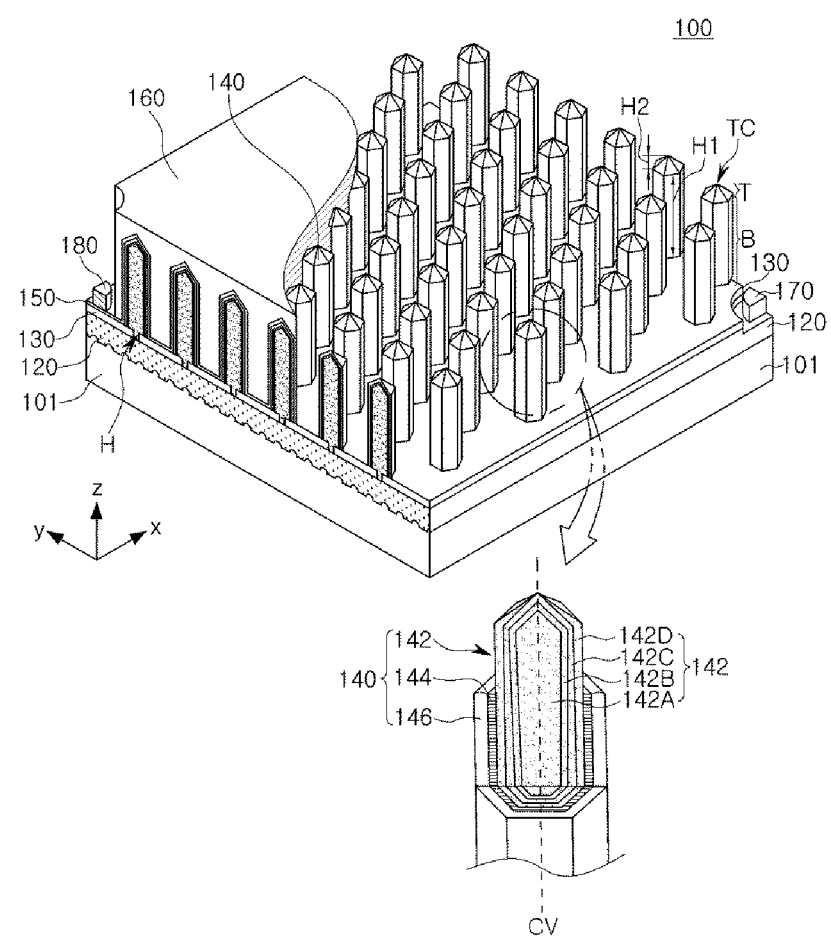
FIG. 1 is a perspective view schematically illustrating a semiconductor light emitting device according to an exemplary embodiment of the present invention.

Hereinafter, exemplary embodiments of the present invention will be described in detail with reference to the accompanying drawings.

The disclosure may, however, be exemplified in many different forms and should not be construed as being limited to the specific embodiments set forth herein. Rather, these embodiments are provided so that this disclosure will be thorough and complete, and will fully convey the scope of the disclosure to those skilled in the art.

In the drawings, the shapes and dimensions of elements may be exaggerated for clarity, and the same reference numerals will be used throughout to designate the same or like elements.

In the present invention, unless otherwise mentioned, terms such as 'upper portion', 'upper surface', 'lower portion', 'lower surface', 'lateral surface', and the like, are determined based on the drawings, and in actuality, the terms may be changed according to a direction in which a device is disposed.

FIG. 1 is a perspective view schematically illustrating a semiconductor light emitting device according to an exemplary embodiment of the present invention.

Referring to FIG. 1, a semiconductor light emitting device 100 includes a substrate 101, and a base layer 120, a mask layer 130, light emitting nanostructures 140, a transparent electrode layer 150, and a filler layer 160 formed on the substrate 101. Each of the light emitting nanostructures 140 includes a first conductivity-type semiconductor core 142, an active layer 144, and a second conductivity-type semiconductor layer 146 grown from the base layer 120 of a first conductivity-type semiconductor. The semiconductor light emitting device 100 may further include first and second electrodes 170 and 180 electrically connected to the base layer 120 and the second conductivity-type semiconductor layer 146, respectively.

In FIG. 1, in order to help in providing an understanding, some components, for example, the transparent electrode layer 150 and the filler layer 160, are illustrated as only being present only in a partial region, and severed surfaces of some components including the light emitting nanostructures 140 are illustrated in one end in an x direction.

The substrate 101 may be provided as a semiconductor growth substrate and may be formed of an insulating, a conductive, or a semiconductive material such as sapphire, SiC, $MgAl_2O_4$, MgO, $LiAlO_2$, $LiGaO_2$, GaN, or the like. A sapphire substrate is a crystal having Hexa-Rhombo R3c symmetry, of which lattice constants in c-axial and a-axial directions are approximately 13.001 Å and 4.758 Å, respectively, and has a C-plane (0001), an A-plane (11-20), an R-plane (1-102), and the like. In this case, the C-plane of sapphire crystal allows a nitride thin film to be relatively easily grown thereon and is stable at high temperatures, so the sapphire substrate is commonly used as a nitride growth substrate. Meanwhile, in a case in which the substrate 101 is formed of silicon (Si), it may be more appropriate for increasing a diameter and is relatively low in price, facilitating mass-production.

A depression and protrusion pattern may be formed on a surface of the substrate 101 to enhance light extraction efficiency. However, a shape of the depression and protrusion pattern is not limited to that illustrated in the drawing. According to an exemplary embodiment, a buffer layer may further be disposed on the substrate 101 in order to enhance crystallinity of the base layer 120. The buffer layer may be formed of, for example, aluminum gallium nitride $Al_xGa_{1-x}N$ grown at a low temperature without being doped.

The substrate 101 may be removed to be omitted according to an exemplary embodiment. For example, in a case in which the semiconductor light emitting device 100 is mounted on an external device such as a package board in a flipchip manner, the substrate 101 may be omitted, and even in the case that silicon (Si) is used as a material of the substrate 101, the substrate 101 may be omitted in a follow-up process.

The base layer 120 may be disposed on the substrate 101. The base layer 120 may be formed of a Group III-V compound, for example, gallium nitride GaN. The base layer 120 may be, for example, n-type gallium nitride n-GaN doped with an n-type impurity.

In the present exemplary embodiment, the base layer 120 may be commonly connected to an end of each light emitting nanostructure 140 to serve as a contact electrode, as well as providing crystal planes for growing the first conductivity-type semiconductor core 142.

The mask layer 130 is disposed on the base layer 120. The mask layer 130 may be formed of a silicon oxide or a silicon nitride. For example, the mask layer 130 may be formed of at least one among silicon oxide ($SiO_x$), silicon oxynitride ($SiO_xN_y$), silicon nitride ($Si_xN_y$), aluminum oxide ($Al_2O_3$), titanium nitride (TiN), aluminum nitride (AlN), zirconium oxide (ZrO), titanium aluminum nitride (TiAlN), and titanium silicon nitride (TiSiN). In particular, the mask layer 130 may be a Distributed Bragg Reflector (DBR) layer or an omni-directional reflector (ODR). In this case, the mask layer 130 may have a structure in which layers having different refractive indices are alternately repeatedly disposed. However, the present inventive concept is not limited thereto and, according to an exemplary embodiment, the mask layer 130 may be a monolayer.

The mask layer 130 may include a plurality of openings H exposing portions of the base layer 120. The diameter, length, position, and growth conditions of the light emitting nanostructures 140 may be determined depending on the size of the plurality of openings H. The plurality of openings H may have various shapes such as a circular shape, quadrangular shape, hexagonal shape, and the like.

The plurality of light emitting nanostructures 140 may be disposed in positions corresponding to the plurality of openings H. The light emitting nanostructures 140 may have a core-shell structure including the first conductivity-type semiconductor core 142 grown from regions of the base layer 120 exposed by the plurality of openings H, and the active layer 144 and the second conductivity-type semiconductor layer 146 sequentially formed on a surface of the first conductivity-type semiconductor core 142. As illustrated, the width of the first conductivity-type semiconductor core 142 may be greater than those of the plurality of openings H, but the relative difference in the widths is not limited to the illustrated configuration.

The first conductivity-type semiconductor core 142 and the second conductivity-type semiconductor layer 146 may respectively be formed of a semiconductor material doped with an n-type impurity and a semiconductor doped with a p-type impurity, but the present inventive concept is not limited thereto and, conversely, the first conductivity-type semiconductor core 142 and the second conductivity-type semiconductor layer 146 may also respectively be formed of p-type and n-type semiconductor materials. The first conductivity-type semiconductor core 142 and the second conductivity-type semiconductor layer 146 may be formed of a nitride semiconductor, e.g., an aluminum indium gallium nitride having a composition of $Al_xIn_yGa_{1-x-y}N$ ($0 \leq x \leq 1$, $0 \leq y \leq 1$, $0 \leq x+y \leq 1$), and each of the semiconductor layers 142 and 146 may be configured as a single layer, or may include a plurality of layers having different characteristics such as different doping concentrations, compositions, and the like. Here, the first conductivity-type semiconductor core 142 and the second conductivity-type semiconductor layer 146 may be formed of an aluminum indium gallium phosphide (AlInGaP) or aluminum indium gallium arsenide (AlInGaAs) semiconductor, besides a nitride semiconductor. In the present exemplary embodiment, the first conductivity-type semiconductor core 142 may be formed of an n-type gallium nitride (n-GaN) doped with silicon (Si) or carbon (C), and the second conductivity-type semiconductor layer 146 may be formed of a p-type gallium nitride (p-GaN) doped with magnesium (Mg) or zinc (Zn), for example.

The active layer 144 may be disposed on a surface of the first conductivity-type semiconductor core 142. The active layer 144 may be a layer emitting light having a predetermined level of energy according to electron-hole recombination and formed of a single material such as indium gallium nitride (InGaN), or the like, or may have a multi-quantum well (MQW) structure in which quantum barrier layers and quantum well layers are alternately disposed, and, for example, in case of a nitride semiconductor, a gallium nitride (GaN)/indium gallium nitride (InGaN) structure may be used. In the case in which the active layer 144 includes indium gallium nitride (InGaN), since the content of indium (In) is increased, crystal defects due to lattice mismatches may be reduced and internal quantum efficiency of the semiconductor light emitting device 100 may be increased. Also, an emission wavelength may be adjusted according to the content of indium (In).

The number of light emitting nanostructures 140 included in the semiconductor light emitting device 100 may not be limited to that illustrated in the drawings and the semiconductor light emitting device 100 may include, for example, tens to millions of light emitting nanostructures 140. The plurality of light emitting nanostructures 140 may be arranged in a hexagonal shape.

Each of the plurality of light emitting nanostructures 140 may include a body portion B having a hexagonal prism shape and a tip portion T having a hexagonal pyramid shape on the body portion B. The body portion B and the tip portion T may also be referred to in the same manner in the first conductivity-type semiconductor core 142, the active layer 144, and the second conductivity-type semiconductor layer 146 constituting the light emitting nanostructures 140. In particular, in the case of the first conductivity-type semiconductor core 142, the body portion B may extend from the base layer 120 to an upper side of the mask layer 130. Since the light emitting nanostructures 140 have a three-dimensional shape, a light emitting surface area is relatively large, increasing luminous efficiency.

The body portion B of each of the light emitting nanostructures 140 may have a first height H1 and the tip portion T may have a second height H2 smaller than the first height H1. For example, the first height H1 may range from 2.5 μm to 4 μm, and the second height H2 may range from 300 nm to 600 nm. The body portion B may have a crystal plane as an m plane, and the tip portion T may have a crystal plane as an r plane.

In the plurality of light emitting nanostructures 140, a percentage by which a vertex TC of the hexagonal pyramid of the tip portion T may be within a distance equal to or less than 1.5% of the width of the body portion B from a central vertical axis CV, for example, within 10 nm from the central vertical axis CV, that is, an axis penetrating through the center of the body portion B in the z direction, may be 60% or greater. The width of the body portion B may vary depending on a light emission wavelength and may range from 700 nm to 1.3 μm, for example. In this case, depending on sizes of each of the light emitting nanostructures 140, a percentage by which the vertex TC of the tip portion T is within 0.7% to 1.5% of the width of the body portion B from the central vertical axis CV may be 60% or greater. Hereinafter, a degree at which the vertex TC of the tip portion T of each of the light emitting nanostructures 140 is positioned to be close to the central vertical axis CV of the body portion B on a plane perpendicular with respect to the central vertical axis CV of the body portion B will be expressed as a term "centering". Namely, centering denotes a degree at which the vertex TC of the tip portion T is positioned to be close to the center of an upper surface of the body portion B, without being inclined in one direction based on the body portion B. Thus, as centering is enhanced, a central vertical axis of the tip portion T may be close to the central vertical axis CV of the body portion B. Also, the width of the body portion B refers to a length of a diagonal line passing through the center of the body portion B on a plane parallel to the upper surface of the substrate 101, and when the body portion B does not have a regular hexagonal shape, the width of the body portion B may refer to a maximal length passing through the center. Centering of the light emitting nanostructures 140 will be described in detail with reference to FIG. 7 hereinbelow.

The first conductivity-type semiconductor cores 142 according to an exemplary embodiment of the present invention may be formed through a plurality of processes, and thus, each of the first conductivity-type semiconductor cores 142 may include first to fourth regions 142A, 142B, 142C, and 142D formed during the different processes. The first and second regions 142A and 142B may have sloped lateral surfaces, and the third region 142C may have lateral surfaces perpendicular to the substrate 101. Relative thicknesses of the first to fourth regions 142A, 142B, 142C, and 142D are not limited to those illustrated.

The first to fourth regions 142A, 142B, 142C, and 142D may be formed of the same material and may have different impurity concentrations. For example, an impurity concentration of the third region 142C may be higher than those of the adjacent second and fourth regions 142B and 142D. For example, the impurity concentration of the third region 142C may be higher by about four to six times than those of the second and fourth regions 142B and 142D. The first to fourth regions 142A, 142B, 142C, and 142D will be described in detail with reference to FIGS. 2A through 3 hereinbelow.

The transparent electrode layer 150 may be electrically connected to the second conductivity-type semiconductor layer 146. The transparent electrode layer 150 may cover upper surfaces and lateral surfaces of the light emitting nanostructures 140 and may be connected between adjacent light emitting nanostructures 140. The transparent electrode layer 150 may be formed of, for example, indium tin oxide (ITO), aluminum zinc oxide (AZO), indium zinc oxide (IZO), zinc oxide (ZnO), GZO (ZnO:Ga), indium oxide ($In_2O_3$), tin oxide ($SnO_2$), cadmium oxide (CdO), cadmium tin oxide ($CdSnO_4$), or gallium oxide ($Ga_2O_3$).

The filler layer 160 may be disposed on the light emitting nanostructures 140 and the transparent electrode layer 150. The filler layer 160 may fill spaces between adjacent light emitting nanostructures 140 and may be disposed to cover the light emitting nanostructures 140 and the transparent electrode layer 150 on the light emitting nanostructures 140. According to an exemplary embodiment, an upper surface of the filler layer 160 may be formed to be uneven along the light emitting nanostructures 140.

The filler layer 160 may be formed of a light-transmissive insulating material and include, for example, silicon dioxide ($SiO_2$), silicon nitride ($SiN_x$), aluminum oxide ($Al_2O_3$), hafnium oxide (HfO), titanium oxide ($TiO_2$), or zirconium oxide (ZrO). However, according to an exemplary embodiment, the filler layer 160 may include a conductive material. In this case, the filler layer 160 may be formed to be electrically connected to the second electrode 180 or may be integrally formed with the second electrode 180. The semiconductor light emitting device 100 may be mounted in a flipchip structure such that the first and second electrodes 170 and 180 face an external board such as a package board.

According to an exemplary embodiment, a passivation layer (not shown) may be disposed on the filler layer 160. The passivation layer may be disposed to expose upper surfaces of the first and second electrodes 170 and 180.

The first and second electrodes 170 and 180 may be disposed on the base layer 120 and the transparent electrode layer 150 on one side of the semiconductor light emitting device 100 such that the first and second electrodes 170 and 180 are electrically connected to the base layer 120 and the second conductivity-type semiconductor layer 146, respectively. However, dispositions and shapes of the first and second electrodes 170 and 180 are merely illustrative and may be variously modified. For example, the first and second electrodes 170 and 180 may be configured to include an electrode pad and an electrode finger extending from the electrode pad. According to an exemplary embodiment of the present invention, in a case in which the substrate 101 is formed of a conductive material, the first electrode 170 may be disposed below the substrate 101 or may be omitted.

The first and second electrodes 170 and 180 may be formed as a monolayer of a conductive material or may have a multilayer structure of a conductive material. For example, the first and second electrodes 170 and 180 may include one or more among gold (Au), silver (Ag), copper (Cu), zinc (Zn, aluminum (Al), indium (In), titanium (Ti), silicon (Si), germanium (Ge), tin (Sn), magnesium (Mg), tantalum (Ta), chromium (Cr), tungsten (W), ruthenium (Ru), rhodium (Rh), iridium (Ir), nickel (Ni), palladium (Pd), platinum (Pt), and alloys thereof.

FIGS. 2A through 2I are cross-sectional views schematically illustrating a method of manufacturing a semiconductor light emitting device according to an exemplary embodiment of the present invention. FIGS. 2A through 2I are cross-sectional views taken to traverse the first and second electrodes 170 and 180 of the semiconductor light emitting device of FIG. 1, and here, the number of light emitting nanostructures 140 is arbitrarily selected for the purposes of illustration.

Referring to FIG. 2A, a depression and protrusion pattern may be formed on an upper surface of the substrate 101 and a first conductivity-type semiconductor may be grown on the substrate 101 to form a base layer 120.

The base layer 120 may provide a crystal growth surface allowing the light emitting nanostructures 140 (refer to FIG. 1) to grow thereon, and may be a structure electrically connecting an end of each light emitting nanostructure 140. Thus, the base layer 120 may be formed as a semiconductor single crystal having electrical conductivity, and in this case, the substrate 101 may be a substrate for crystal growth.

Referring to FIG. 2B, an mask layer 130 and a mold layer 135 having a plurality of openings H exposing the base layer 120 may be formed on the base layer 120.

First, a material for forming the mask layer 130 and a material for forming the mold layer 135 may be sequentially deposited and patterned using a mask pattern to form the plurality of openings H, thus forming the mask layer 130 and the mold layer 135. The plurality of openings H may have a cylindrical shape having a downwardly reduced diameter, and thus, lateral surfaces of the plurality of openings H may have a predetermined slope angle ($\theta_A$) with respect to an upper surface of the substrate 101. The slope angle ($\theta_A$) may range from 70 degrees to 90 degrees, for example.

The mask layer 130 and the mold layer 135 may be formed of materials having different etching rates under particular etching conditions, and may also be formed of materials having different etching rates from that of the base layer 120. Accordingly, an etching process may be controlled when the plurality of openings H are formed. For example, the mask layer 130 is formed of silicon nitride (SiN), and the mold layer 135 is formed of a silicon dioxide ($SiO_2$).

The sum of thicknesses of the mask layer 130 and the mold layer 135 may be designed in consideration of an intended height of the light emitting nanostructures 140 (refer to FIG. 1). Also, a size of the plurality openings H may be designed in consideration of an intended size of the light emitting nanostructures 140.

Figure 2C:
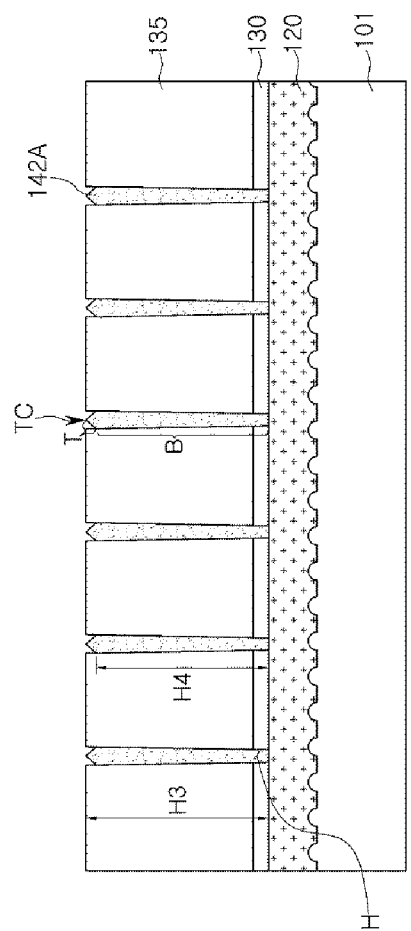

Referring to FIG. 2C, a first conductivity-type semiconductor is grown on the base layer 120 exposed by the plurality of openings H to form first regions 142A of a plurality of first conductivity-type semiconductor cores 142 (refer to FIG. 1).

The first region 142A may have sloped lateral surfaces such that an upper portion thereof has a larger diameter, like the shapes of the plurality of openings H. Also, when the plurality of openings H have a cylindrical shape, the body portion B of the first region 142A may have a cylindrical shape and the tip portion T of the first region 142A may have a hexagonal pyramid shape or a conical shape in which corners are partially incomplete. In the present exemplary embodiment, a height from the upper surface of the base layer 120 to an upper surface of the mold layer 135 may be a third height H3, and a height from the upper surface of the base layer 120 to an upper end of the body portion B of the first region 142A may be a fourth height H4 equal to or lower than the third height H3.

The first region 142A may be formed of, for example, an n-type nitride semiconductor and may be formed of a material identical to that of the base layer 120. The first region 142A may be formed through a metal-organic chemical vapor deposition (MOCVD) or a molecular beam epitaxy (MBE) process.

In this process, in order to dispose the vertex TC of the tip portion T of the first region 142A such that it is close to the center of the upper surface of the body portion B, namely, in order to enhance centering, process conditions such as flux of a supplied precursor, a temperature, or the like may be controlled.

For example, in a case in which the first region 142A is formed of a gallium nitride (GaN)-based material, a gallium precursor and a nitrogen precursor may be supplied, and a ratio of the supplied gallium precursor to the nitrogen precursor may range from 1.4 to 2.0. By adjusting the flux of nitrogen precursor to be smaller, a region grown within a chamber in which the process is performed is prevented from being partially grown, and thus, a growth rate of the first region 142A may be reduced.

Also, a process temperature may be determined within a range of 900° C. to 1000° C. When the process temperature is lower than the foregoing range, growth efficiency may be degraded. Also, when the process temperature is higher than the foregoing range, the precursor material on the growth substrate is actively spread to accelerate an abnormal growth that growing occurs in a thermodynamically unstable surface, and thus, a growth rate at the edges of the tip portion T may increase to degrade centering.

The first region 142A tends to have increased growth rate as a growth height thereof is higher, and thus, abnormal growth in an upper portion thereof increased as an aspect ratio was greater. Thus, by controlling the process conditions as in the present exemplary embodiment, the precursor contributes to growth in a stable site to enhance centering. Centering affects growth of an m plane of the body portion B in follow-up processes, and when centering is enhanced, the body portion B may be formed to have a hexagonal prism shape without being distorted.

Figure 2D:
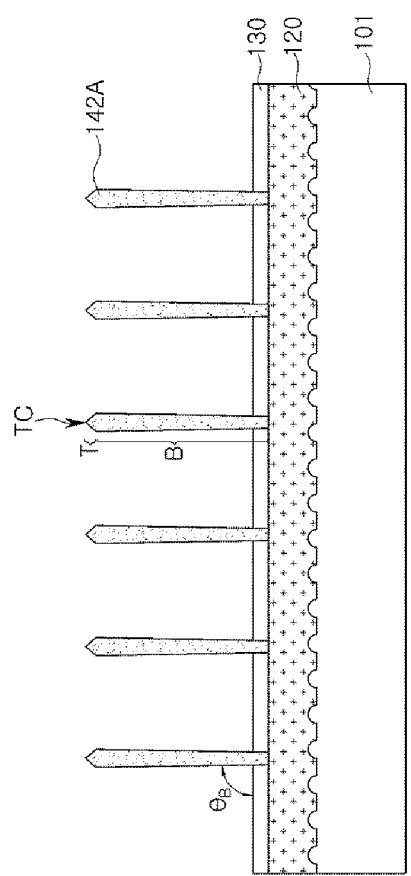

Referring to FIG. 2D, the mold layer 135 may be removed to expose a portion of the first region 142A.

First, the mold layer 135 may be selectively removed with respect to the mask layer 130 and the first region 142A, leaving the mask layer 130. The removing process may be performed based on, for example, a wet etching process. The mask layer 130 may serve to prevent the active layer 144 and the second conductivity-type semiconductor layer 146 formed during a follow-up process from being connected to the based layer 120.

The first region 142A may have a predetermined slope angle ($\theta_B$) with respect to the upper surface of the substrate 101. The slope angle ($\theta_B$) may be similar to the slope angle ($\theta_A$) of the openings H described above with reference to FIG. 2B, and may have a range of 70 degrees to 90 degrees, for example.

Figure 2E:
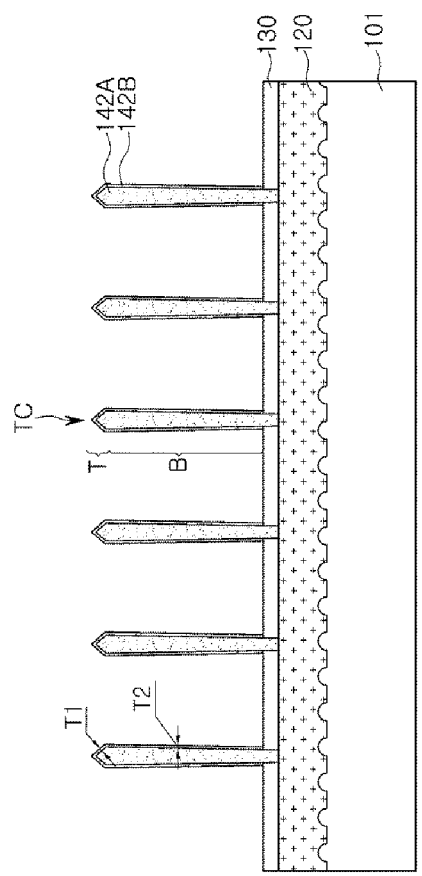

Referring to FIG. 2E, the second region 142B of each of the plurality of first conductivity-type semiconductor core 142 may be formed on an exposed surface of the first region 142A.

The second region 142B may be adjusted to be grown at a relatively low rate in order to control a hexagonal pyramid shape of the tip portion T. The second region 124B may be formed, for example, under a nitrogen ($N_2$) atmosphere, and a gallium precursor, a nitrogen precursor, and a source gas of an impurity may be supplied to an interior of a process chamber. For example, triethylgallium (TEGa) may be supplied as the gallium precursor and ammonia ($NH_3$) may be used as the nitrogen precursor. A process temperature may be determined within a range of 950° C. to 1050° C. Also, process pressure may be selected within a relatively high pressure range, for example, within a range of 180 mbar to 220 mbar to reduce a difference between growth rates of the tip portion T and the body portion B.

The second region 142B may be formed to have a first thickness T1 in the tip portion T and have a second thickness T2 equal to or greater than the first thickness T1 in the body portion B.

Figure 2F:
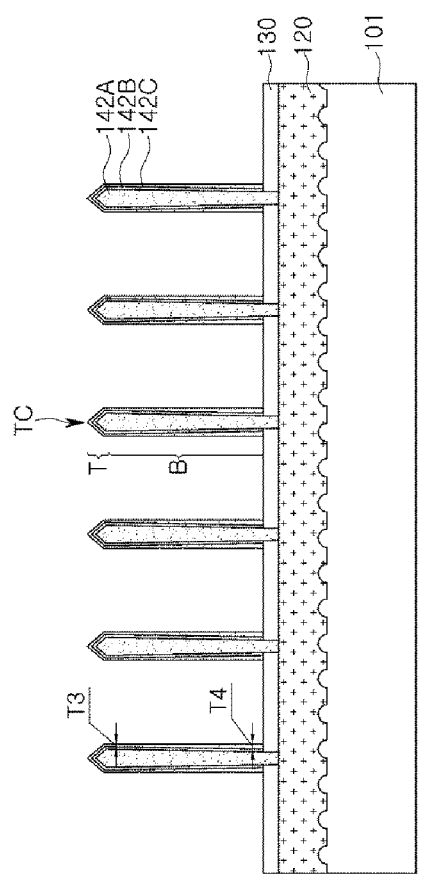

Referring to FIG. 2F, a third region 142C of each of the plurality of first conductivity-type semiconductor cores 142 may be formed on the second region 142B.

The third region 142C may be adjusted such that the body portion B thereof is grown at a rate faster than that of the second region 142B in order to control a hexagonal prism shape of the body portion B. The third region 142C may be formed, for example, under a hydrogen ($H_2$) atmosphere, and a gallium precursor, a nitrogen precursor, and a source gas of an impurity may be supplied to the interior of the process chamber. For example, trimethylgallium (TMGa) which is easily decomposed under the hydrogen ($H_2$) atmosphere may be supplied as the gallium precursor and ammonia ($NH_3$) may be used as the nitrogen precursor. Under the hydrogen ($H_2$) atmosphere, r planes of the tip portion T may be passivated by hydrogen ($H_2$), and thus, growth of the body portion B may be induced, relative to the tip portion T.

An amount of the source gas of the impurity may be adjusted such that a concentration of an impurity injected to form the third region 142C is higher than a concentration of an impurity of the second region 142B and that of the fourth region 142D to be formed in a follow-up process. For example, an amount of an impurity source supplied to form the third region 142C may be five to seven times that of the impurity source supplied to form the second and fourth regions 142B and 142D. Accordingly, the concentration of the impurity of the third region 142C may be five to seven times higher than those of the second region 142B and the fourth region 142D. However, when the impurity of the third region 142C is partially spread to the vicinity, the difference in concentration may be alleviated, and thus, the concentration of the impurity of the third region 142C may be about four to six times higher than those of the second region 142B and the fourth region 142D.

A process temperature may be determined within a temperature range higher than that for forming the second region 142B, for example, within a range of 1050° C. to 1150° C. Also, process pressure may be selected from within a pressure range lower than that for forming the second region 142B, for example, from within a range of 80 mbar to 120 mbar.

The third region 142C may be formed to be thicker in the body portion B than in the tip portion T. Also, an upper portion of the body portion B may be formed to have a third thickness T3 and a lower portion of the body portion B may be formed to have a fourth thickness T4 greater than the third thickness T3.

Figure 2G:
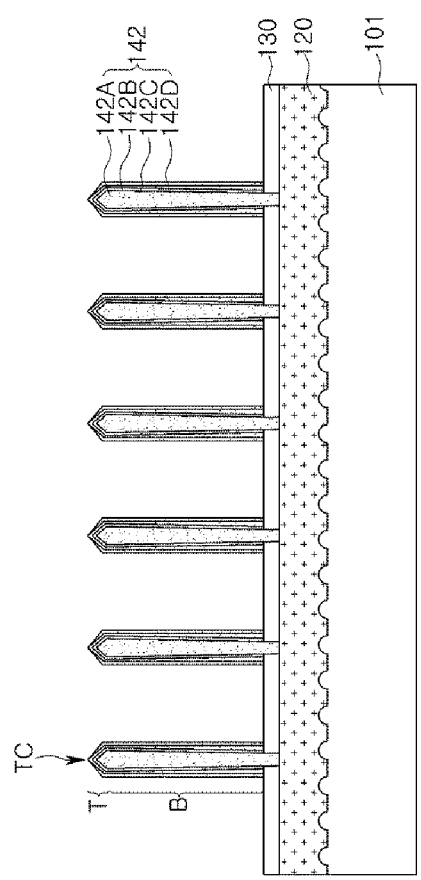

Referring to FIG. 2G, a fourth region 142D of each of the plurality of first conductivity-type semiconductor core 142 may be formed on the third region 142C.

The fourth region 142D may be controlled to be grown at a relatively low rate in order to control the overall shape of the first conductivity-type semiconductor cores 142 through self-limitation growth. Process conditions for forming the fourth region 142D may be identical or similar to the process conditions for forming the second region 142B. The fourth region 142D may be formed, for example, under a nitrogen (N$_2$) atmosphere. Also, a process temperature may be determined within a range of 950° C. to 1050° C.

The fourth region 142D serves to allow crystal planes of each of the first conductivity-type semiconductor cores 142 to be perfectly formed through self-limitation growth, and thus, the thickness of the fourth region 142D may be varied, according to exemplary embodiments and is not limited to the relative thickness as illustrated. For example, the fourth region 142D may have a small thickness relative to those of the first to third regions 142A, 142B, and 142C. Also, in FIG. 2G, it is illustrated that the vertex TC of the tip portion T of the fourth region 142D coincides with the third region 142C, but the present inventive concept is not limited thereto and the vertex TC of the tip portion T of the fourth region 142D may be varied, according to exemplary embodiments.

By forming the fourth region 142D, the first conductivity-type semiconductor cores 142 each including the first to fourth regions 142A, 142B, 142C, and 142D may be formed. According to the present exemplary embodiment, after the first region 142A is formed, the other regions of the first conductivity-type semiconductor cores 142 may be formed as the three divided regions of the second to fourth regions 142B, 142C, and 142D. Accordingly, by increasing a doping concentration of an impurity, for example, silicon (Si), in the first conductivity-type semiconductor cores 142, abnormal growth of the first conductivity-type semiconductor cores 142 that may occur due to supply of an impurity source can be prevented, while enhancing luminous efficiency. In detail, if only the second and third regions 142B and 142C are formed on the first region 142A, a percentage by which the vertex TC of the tip portion T is not disposed within the 10 nm from the central vertical axis CV of the body portion B amounts to about 60%, but, by forming the fourth region 142D, the percentage is reduce to 3% over the same silicon doping concentration.

However, the present inventive concept is not limited thereto and according to exemplary embodiments, formation of a portion of the first to fourth regions 142A, 142B, 142C, and 142D may be omitted. For example, in a particular exemplary embodiment, each of the first conductivity-type semiconductor cores 142 may include only the first to third regions 142A, 142B, and 142C, excluding the fourth region 142D.

Figure 2H:
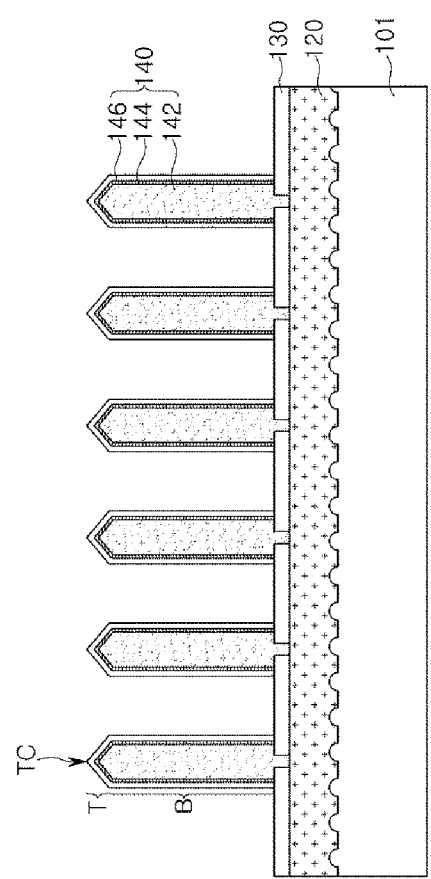
Figure 21:
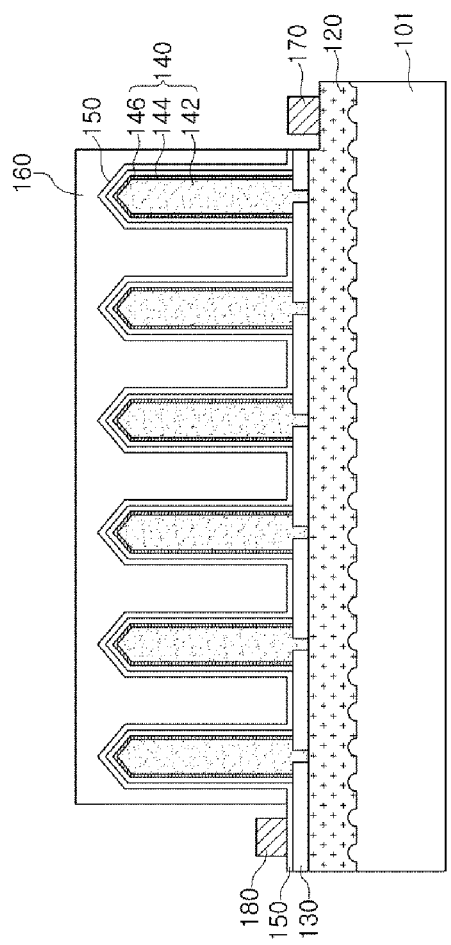

Referring to FIG. 2H, the active layer 144 and the second conductivity-type semiconductor layer 146 may be formed on each of the first conductivity-type semiconductor cores 142.

In this stage, the light emitting nanostructures 140 having a core-shell structure may be formed. According to deposition methods, the active layer 144 and the second conductivity-type semiconductor layer 146 may have different thicknesses in the m planes and the r planes of each of the first conductivity-type semiconductor cores 142. For example, the active layer 144 and the second conductivity-type semiconductor layer 146 may be thicker in the body portion B than in the tip portion T.

According to exemplary embodiments, an electrical charge blocking layer may be further disposed on the active layer 144. Also, according to exemplary embodiments, the active layer 144 may not be disposed on the sloped surface of the tip portion of each of the first conductivity-type semiconductor cores 142 and the electrical charge blocking layer may be disposed instead. The electrical charge blocking layer may serve to prevent electrical charges injected from each of the first conductivity-type semiconductor cores 142 from being moved to the second conductivity-type semiconductor layer 146, rather than being used for electron-hole recombination. The electrical charge blocking layer may include a material having band gap energy greater than that of the active layer 144, and for example, the electrical charge blocking layer may include aluminum gallium nitride (AlGaN) or aluminum indium gallium nitride (AlInGaN).

Referring to FIG. 2I, a transparent electrode layer 150 and a filler layer 160 may be formed on the second conductivity-type semiconductor layer 146.

The transparent electrode layer 150 may extend to cover upper surfaces of the mask layer 130 between adjacent light emitting nanostructures 140 and may be formed as a single layer on the plurality of light emitting nanostructures 140.

According to an exemplary embodiment, the filler layer 160 may be formed as a plurality of layers, and in this case, the plurality of layers may be formed of different materials, respectively, or when the plurality of layers are formed of the same material, the layers may be formed through different deposition processes.

Thereafter, a region of the base layer 120 is exposed to form a first electrode 170, and a second electrode 180 may be formed on the transparent electrode layer 150.

According to exemplary embodiments, a reflective electrode layer, instead of the transparent electrode layer 150, may be formed, and the reflective electrode layer may include silver (Ag) or aluminum (Al). In this case, the semiconductor light emitting device may be mounted on an external device such as a package board in a flipchip manner.

Figure 3:
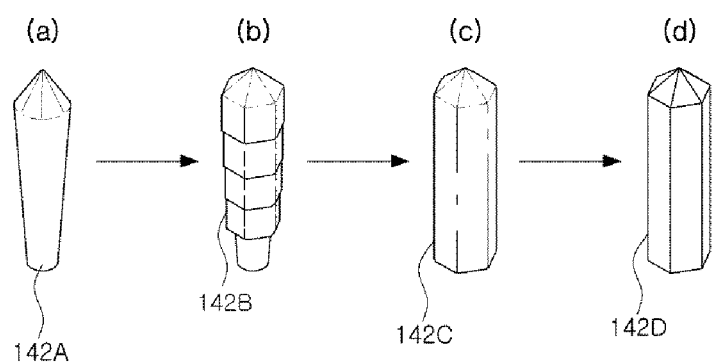
FIG. 3 is a schematic view illustrating a process of forming a first conductivity-type semiconductor core according to the method of manufacturing a semiconductor light emitting device according to an exemplary embodiment of the present invention.

FIG. 3 is a schematic view illustrating a process of forming a first conductivity-type semiconductor core according to the method of manufacturing a semiconductor light emitting device according to an exemplary embodiment of the present invention.

Referring to FIG. 3, the first to fourth regions 142A, 142B, 142C, and 142D of the first conductivity-type semiconductor cores 142 described above with reference to FIGS. 1 through 2I are sequentially illustrated.

In a case in which the openings H of the mold layer 135 of FIG. 2B has a cylindrical shape, as illustrated in (a) of FIG. 3, the first region 142A may have a body portion B having a cylindrical shape or a hexagonal prism shape with rounded or smoothed corners and a tip portion T having a conical shape or a hexagonal pyramid shape with rounded corners. For example, the body portion B of the first region 142A is formed to correspond to the shape of the openings H, and the tip portion T is freely formed in a space so as to be grown along crystallographically stable planes to have a hexagonal pyramid shape. In this case, the first region 142A may have the cylindrical body portion B and the tip portion T having a hexagonal pyramid shape with rounded corners. The first region 142A may be formed to have high centering based on the various process conditions described above with reference to FIG. 2C. The centering of the first region 142A may be reflected and maintained while the second to fourth regions 142B, 142C, and 142D are being formed in a follow-up process.

As illustrated in (b) of FIG. 3, the tip portion T may be formed to have a hexagonal pyramid shape. The second region 142B is grown on both of the tip portion T and the body portion B. The second region 142B may be formed at a low speed such that the tip portion T mainly has a stable shape thermodynamically and crystallographically.

As illustrated in (c) of FIG. 3, the third region 142C may be formed such that the body portion B has a hexagonal prism shape. The third region 142C is grown in both of the tip portion T and the body portion B. The third region 142C may be formed at a high speed such that the body portion B mainly has a stable shape thermodynamically and crystallographically.

As illustrated in (d) of FIG. 3, the fourth region 142D may be additionally grown to control the overall shape of each of the first conductivity-type semiconductor cores 142. By forming the fourth region 142D, each of the first conductivity-type semiconductor cores 142 may have body portion B having a hexagonal prism shape and the tip portion T having a hexagonal pyramid shape. However, according to exemplary embodiments, the formation of the fourth region 142D may be omitted.

According to an exemplary embodiment of the present invention, by controlling centering and uniformly growing the body portion B, the active layer 144, a light emitting layer, may be uniformly grown on the uniformly grown m planes, and thus, light can be uniformly emitted from the plurality of light emitting nanostructures 140.

Figure 4:
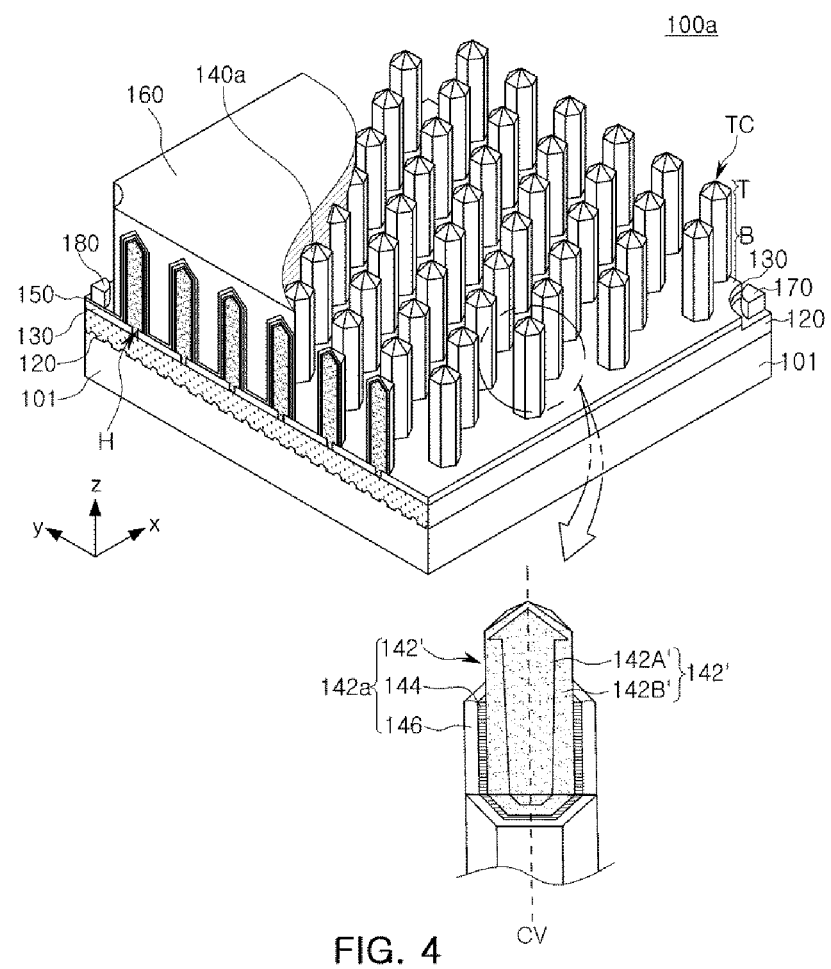
FIG. 4 is a perspective view schematically illustrating a semiconductor light emitting device according to an exemplary embodiment of the present invention.

FIG. 4 is a perspective view schematically illustrating a semiconductor light emitting device according to an exemplary embodiment of the present invention.

In FIG. 4, reference numerals the same as those of FIG. 1 denote the same components, and thus, redundant descriptions thereof will be omitted.

Referring to FIG. 4, a semiconductor light emitting device 100a includes a substrate 101, and a base layer 120, a mask layer 130, light emitting nanostructures 140a, a transparent electrode layer 150, and a filler layer 160 formed on the substrate 101. Each of the light emitting nanostructures 140a includes a first conductivity-type semiconductor core 142', an active layer 144, and a second conductivity-type semiconductor layer 146 grown from the base layer 120 of a first conductivity-type semiconductor. The semiconductor light emitting device 100a may further include first and second electrodes 170 and 180 electrically connected to the base layer 120 and the second conductivity-type semiconductor layer 146, respectively.

In FIG. 4, in order to help in providing an understanding, some components, for example, the transparent electrode layer 150 and the filler layer 160, are illustrated only in a partial region, and severed surfaces of some components including the light emitting nanostructures 140a are illustrated in one end in an x direction.

Each of the plurality of light emitting nanostructures 140a may include a body portion B having a hexagonal prism shape and a tip portion T having a hexagonal pyramid shape on the body portion B. The body portion B and the tip portion T may also be referred to in the same manner for the first conductivity-type semiconductor core 142', the active layer 144, and the second conductivity-type semiconductor layer 146 constituting light emitting nanostructures 140a. In particular, in case of the first conductivity-type semiconductor core 142', the body portion B may extend from the base layer 120 to an upper side of the mask layer 130. In the plurality of light emitting nanostructures 140a, a percentage by which the vertex TC of the hexagonal pyramid of the tip portion T may be disposed within 10 nm from the center of an upper surface of the body portion B may be 60% or greater.

The first conductivity-type semiconductor cores 142' according to an exemplary embodiment of the present invention may be formed through a plurality of processes, and thus, each of the first conductivity-type semiconductor cores 142' may include first and second regions 142A' and 142B' formed during the different processes. The first region 142A' may have sloped lateral surfaces, and the second region 142B' may have lateral surfaces perpendicular to the substrate 101. The first and second regions 142A' and 142B' may be formed of the same material. The first and second regions 142A' and 142B' will be described in more detail with reference to FIGS. 5A through 6.

FIGS. 5A through 5D are cross-sectional views schematically illustrating a method of manufacturing a semiconductor light emitting device according to an exemplary embodiment of the present invention. FIGS. 5A through 5D are cross-sectional views taken to traverse the first and second electrodes 170 and 180 of the semiconductor light emitting device of FIG. 4, and here, the number of light emitting nanostructures 140a is arbitrarily selected for the purposes of illustration.

First, as described above with reference to FIGS. 2A and 2B, a process of forming a base layer 120, a mask layer 130, and a mold layer 135 on the substrate 101 may be performed.

Figure 5A:
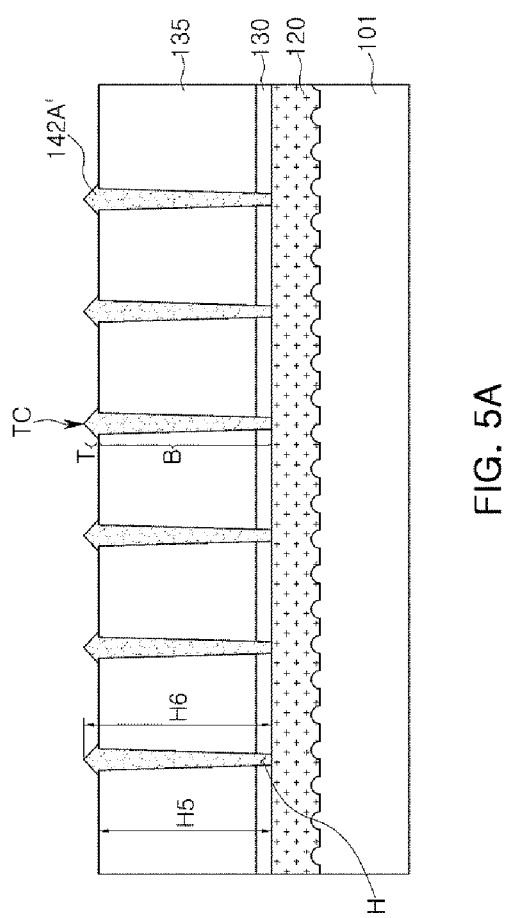
FIGS. 5A through 5D are cross-sectional views schematically illustrating a method of manufacturing a semiconductor light emitting device according to an exemplary embodiment of the present invention.

Next, referring to FIG. 5A, a first region 142A' of each of the plurality of first conductivity-type semiconductor cores 142' (refer to FIG. 4) may be formed by growing a first conductivity-type semiconductor from the base layer 120 exposed by a plurality of openings H.

The first region 142A' may have sloped lateral surfaces such that an upper portion thereof has a larger diameter, like the shapes of the plurality of openings H. Also, when the plurality of openings H has a cylindrical shape, the body portion B of the first region 142A' may have a cylindrical shape. The tip portion T of the first region 142A' may be formed on the mold layer 135 and may have a hexagonal pyramid shape. Thus, the width of the lower surface of the tip portion T may be greater than the width of the body portion B. When the height from an upper surface of the base layer 120 to an upper surface of the mold layer 135 is a fifth height H5, the height from the upper surface of the base layer 120 to the vertex TC of the tip portion T of the first region 142A' may be a sixth height H6 greater than the fifth height H5.

In this process, in order to dispose the vertex TC of the tip portion T of the first region 142A' such that it is close to the center of the upper surface of the body portion B, namely, in order to enhance centering, the tip portion T may be formed above the mold layer 135, rather than being formed within the mold layer 135. In a case in which the tip portion T is formed within the mold layer 135, a deposition material may be spread along the side walls of the mold layer 135 where the openings H are formed, increasing a growth rate at the edges of the tip portion T to relatively degrade centering. However, as in the present exemplary embodiment, in the case in which the tip portion T is formed above the mold layer 135, a deposition material may be evenly transferred and grown along thermodynamically stable surfaces, further enhancing centering.

Figure 5B:
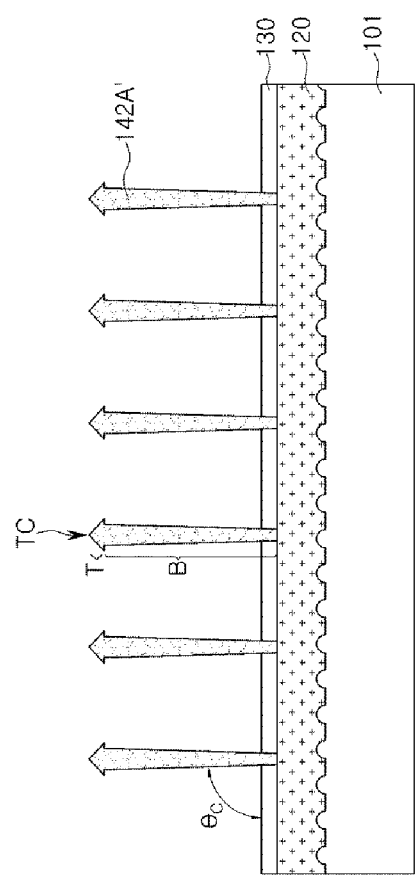

Referring to FIG. 5B, the mold layer 135 may be removed to expose a portion of the first region 142A'.

First, the mold layer 135 may be selectively removed with respect to the mask layer 130 and the first region 142A', leaving the mask layer 130. The removing process may be performed based on, for example, a wet etching process. The mask layer 130 may serve to prevent the active layer 144 and the second conductivity-type semiconductor layer 146 formed during a follow-up process from being connected to the based layer 120.

The first region 142A' may have a predetermined slope angle ($\theta_C$) with respect to the upper surface of the substrate 101. The slope angle ($\theta_C$) may be similar to a slope angle of the openings H described above with reference to FIG. 5A, and may have a range of 70 degrees to 90 degrees, for example.

Figure 5C:
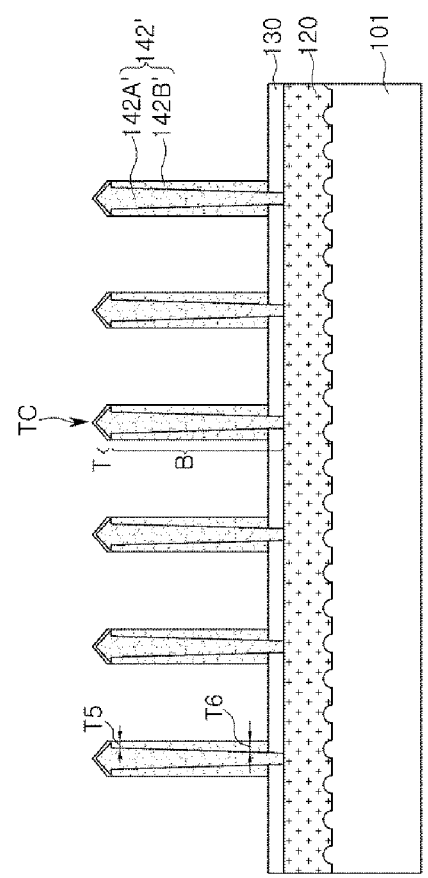

Referring to FIG. 5C, the second region 142B' of each of the plurality of first conductivity-type semiconductor core 142' may be formed on an exposed surface of the first region 142A'.

In order to form the body portion B having a hexagonal prism shape of the second region 142B', process conditions may be adjusted such that the body portion B may be preferentially grown. The second region 142B' may be formed under a hydrogen ($H_2$) atmosphere, for example. For example, trimethylgallium (TMGa), which is easily decomposed under the hydrogen ($H_2$) atmosphere, may be used as a gallium precursor. Under the hydrogen ($H_2$) atmosphere, r planes of the tip portion T may be passivated by hydrogen ($H_2$), and thus, growth of the body portion B may be induced, relative to the tip portion T. A process temperature may be determined within a temperature range of 1050° C. to 1150° C., for example. Also, process pressure may be selected from within range of 80 mbar to 120 mbar.

The second region 142B' may be formed to be thicker in the body portion B than in the tip portion T. Also, an upper portion of the body portion B may be formed to have a fifth thickness T5 and a lower portion of the body portion B may be formed to have a sixth thickness T6 greater than the fifth thickness T5.

According to exemplary embodiments, a region corresponding to the fourth region 142D described above with reference to FIG. 2G may be further formed on the second region 142B'.

Figure 5D:
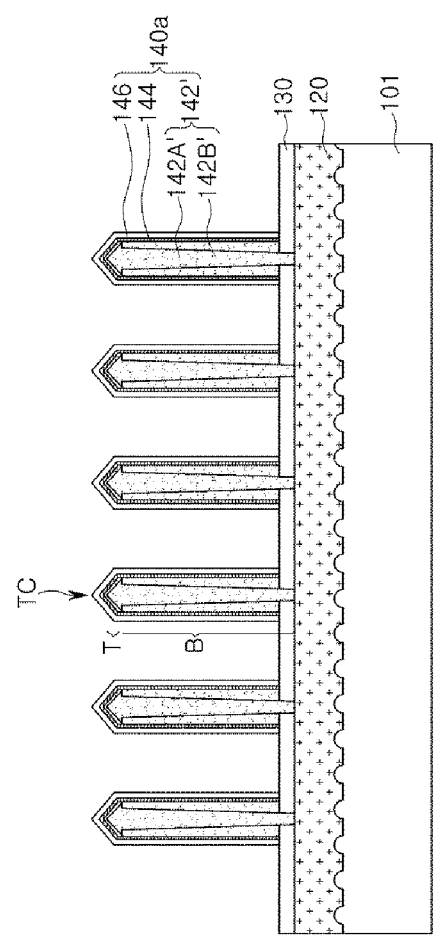

Referring to FIG. 5D, the active layer 144 and the second conductivity-type semiconductor layer 146 may be formed on each of the first conductivity-type semiconductor cores 142'.

In this stage, the light emitting nanostructures 140a having a core-shell structure may be formed. According to deposition methods, the active layer 144 and the second conductivity-type semiconductor layer 146 may have different thicknesses in the m planes and the r planes of each of the first conductivity-type semiconductor cores 142'. For example, the active layer 144 and the second conductivity-type semiconductor layer 146 may be thicker in the body portion B than in the tip portion T.

Figure 6:
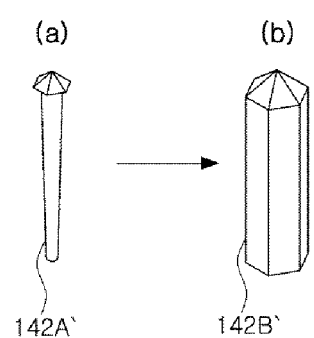
FIG. 6 is a schematic view illustrating a process of forming a first conductivity-type semiconductor core according to the method of manufacturing a semiconductor light emitting device according to an exemplary embodiment of the present invention.

FIG. 6 is a schematic view illustrating a process of forming a first conductivity-type semiconductor core according to the method of manufacturing a semiconductor light emitting device according to an exemplary embodiment of the present invention.

Referring to FIG. 6, the first and second regions 142A' and 142B' of the first conductivity-type semiconductor cores 142' described above with reference to FIGS. 4A though 5D are sequentially illustrated.

In a case in which the openings H of the mold layer 135 of FIG. 5A has a cylindrical shape, as illustrated in (a) of FIG. 6, the first region 142A' may have a body portion B having a cylindrical shape or a hexagonal prism shape with rounded or smoothed corners and a tip portion T having a conical shape or a hexagonal pyramid shape with angulated corners. For example, the body portion B of the first region 142A' is formed to correspond to the shape of the openings H, and the tip portion T is freely formed in a space so as to be grown along crystallographically stable planes to have a hexagonal pyramid shape. Also, since a lower end of the tip portion T is grown without being fixed by the body portion B, the tip portion T may be grown to have a hexagonal pyramid shape. Thus, the first region 142A' may have the cylindrical body portion B and the tip portion T having a hexagonal pyramid shape, and the first region 142A' may be formed to have high centering. The centering of the first region 142A' may be maintained even in the case that the second region 142B' is formed in a follow-up process.

As illustrated in (b) of FIG. 6, the second region 142B' may be formed such that the body portion B has a hexagonal prism shape. The second region 142B' is grown in both of the tip portion T and the body portion B. The second region 142B' may be formed at a high speed such that the body portion B mainly has a stable shape thermodynamically and crystallographically.

According to exemplary embodiments, a region corresponding to the fourth region 142D described above with reference to FIG. 3 may be further formed on the second region 142B'.

According to an exemplary embodiment of the present invention, by controlling centering and uniformly growing the body portion B, the active layer 144, a light emitting layer, may be uniformly grown on the uniformly grown m planes, and thus, light can be uniformly emitted from the plurality of light emitting nanostructures 140a.

Figure 7A:
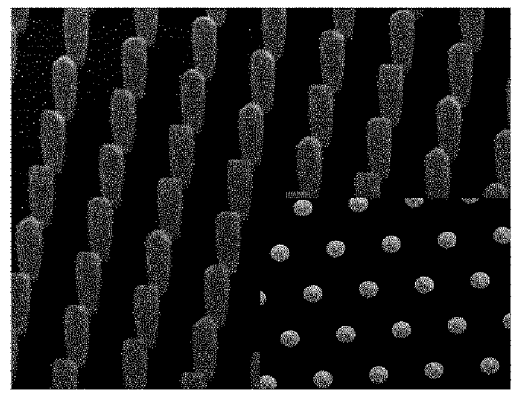
FIGS. 7A through 7C are microscopic images of first conductivity-type semiconductor cores based on a method for manufacturing a semiconductor light emitting device according to an exemplary embodiment of the present invention.
Figure 7B:
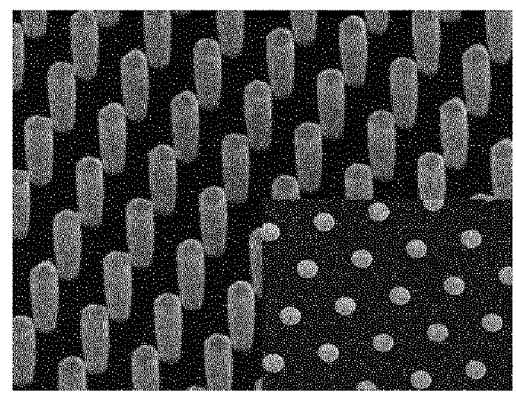
Figure 7C:
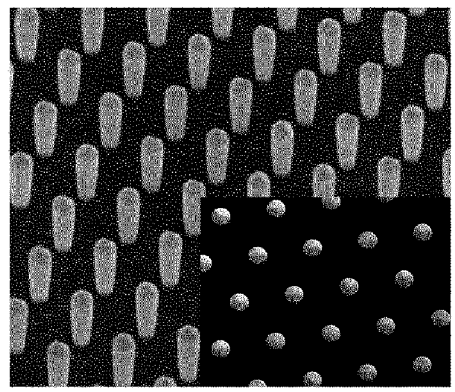

FIGS. 7A through 7C are microscopic images of first conductivity-type semiconductor cores based on a method for manufacturing a semiconductor light emitting device according to an exemplary embodiment of the present invention.

FIGS. 7A through 7C illustrate results of analyzing the first regions 142A of the first conductivity-type semiconductor cores 142 (refer to FIG. 1) by scanning electron microscopy (SEM).

FIGS. 7A and 7B show first regions 142A of the first conductivity-type semiconductor cores 142 according to comparative examples 1 and 2, and FIG. 7C shows the first regions 142A of the first conductivity-type semiconductor cores 142 according to an embodiment of the present invention described above with reference to FIG. 2C. Compared with the embodiment of the present invention, in comparative example 1, flux and a process temperature were different, and in comparative example 2, only a process temperature was different. In detail, in the case of comparative example 1, the first regions 142A were grown under conditions in which a ratio of a supplied gallium precursor to a nitrogen precursor ranged from 0.7 to 0.9 and a process temperature was about 1100° C. In the case of comparative example 2, the first regions 142A were grown under conditions in which a process temperature was about 1100° C.

Table 1 shows degrees of centering of the first regions 142A of each case. The values denote percentages by which vertices TC of the tip portions T are spaced apart from the central vertical CV axis of the body portions B. "Not-formed" denotes a case in which the vertex TC of the tip portion T is not formed to be sufficiently recognizable.

TABLE 1

| | Within 10 nm [%] | From 10 nm to 90 nm [%] | From 90 nm to 180 nm [%] | Not formed [%] |
|---|---|---|---|---|
| Comparative example 1 | 0.00 | 6.40 | 0.00 | 93.50 |
| Comparative example 2 | 20.50 | 66.70 | 0.00 | 12.80 |
| Embodiment | 66.70 | 33.30 | 0.00 | 0.00 |

Referring to FIGS. 7A through 7C and Table 1, in the case of comparative example 2 in which a growth rate was reduced by adjusting flux of a precursor, the percentage of centering within 10 nm was increased to 20.50%, compared with comparative example 1. Also, in the case of embodiment of the present invention in which both flux of a precursor and a process temperature were controlled, the percentage of centering within 10 nm was further increased to more than 60%, specifically, 66.70%, compared with comparative example 2.

In the embodiment, the width of the first region 142A may range from 340 nm to 380 nm, for example, and as the second to fourth regions 142B, 142C, and 142D are formed in a follow-up process, the width may range from 430 nm to 470 nm. The distances in which the vertices TC of the tip portions T are spaced apart from the central vertical axis CV of the body portions B are values measured in the first region 142A. However, although the second to fourth regions 142B, 142C, and 142D are formed in a follow-up process, centering is rarely changed and the same centering rate in the first region 142A of each of the first conductivity-type semiconductor cores 142 was maintained.

Thus, since the centering was enhanced, m planes were stably grown in a follow-up process, and thus, variations of the wavelength of light emitted from the plurality of light emitting nanostructures 140 was reduced.

Figure 8:
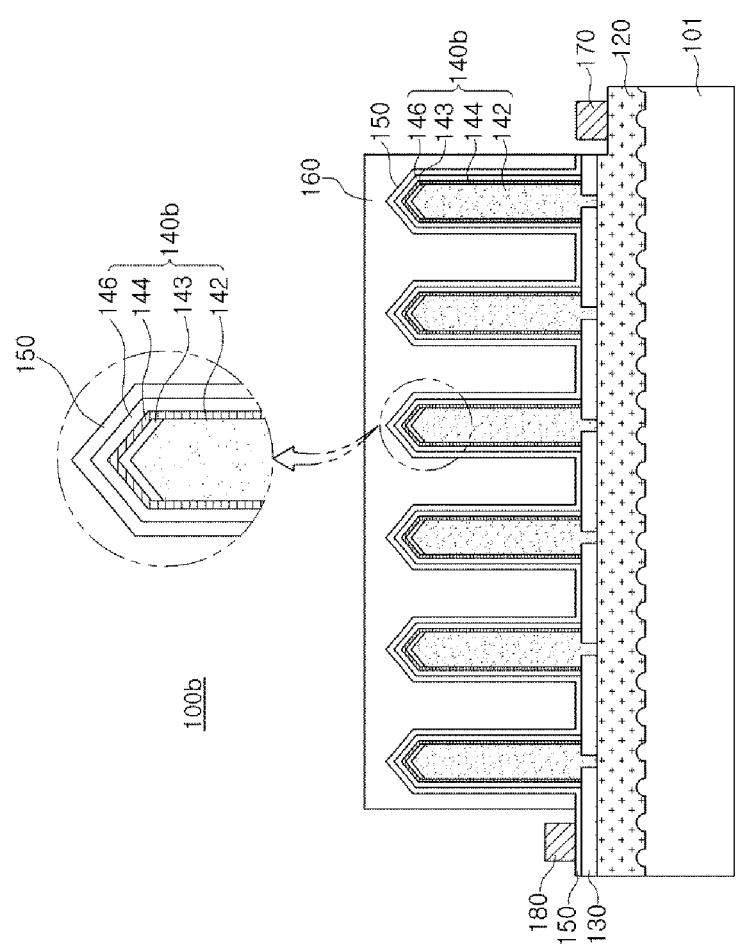
FIG. 8 is a cross-sectional view schematically illustrating a semiconductor light emitting device according to an exemplary embodiment of the present invention.

FIG. 8 is a cross-sectional view schematically illustrating a semiconductor light emitting device according to an exemplary embodiment of the present invention.

Referring to FIG. 8, a semiconductor light emitting device 100b includes substrate 101 and a base layer 120, a mask layer 130, light emitting nanostructures 140b, a transparent electrode layer 150, and a filler layer 160 formed on the substrate 101. Each of the light emitting nanostructures 140b includes a first conductivity-type semiconductor core 142 grown on the base layer 120, a highly resistive layer 143, an active layer 144, and a second conductivity-type semiconductor layer 146. The semiconductor light emitting device 100b may further include a first electrode 170 and a second electrode 180 electrically connected to the base layer 120 and the second conductivity-type semiconductor layer 146, respectively.

Although not shown in detail in FIG. 8, the first conductivity-type semiconductor core 142 may include first to fourth regions 142A, 142B, 142C, and 142D or include first and second regions 142A' and 142B' as illustrated in FIG. 1 or FIG. 4.

In the present exemplary embodiment, a highly resistive layer 143 may be further disposed on the sloped surface of the tip portion of the first conductivity-type semiconductor core 142. However, according to exemplary embodiments, the highly resistive layer 143 may be disposed on a surface of the active layer 144.

The highly resistive layer 143 may be formed of a material having high electrical resistance to block a leakage current that may be generated in the tip portion of the first conductivity-type semiconductor core 142. For example, the highly resistive layer 143 may be formed of an undoped semiconductor or a semiconductor material doped with an impurity having a conductivity type opposite that of the first conductivity-type semiconductor core 142. For example, in a case in which the first conductivity-type semiconductor core 142 is formed of an n-type gallium nitride (n-GaN), the highly resistive layer 143 may be formed of an undoped gallium nitride (GaN) or may be formed of a gallium nitride (GaN) doped with a p-type impurity such as magnesium (Mg). However, a composition of the highly resistive layer 143 may be varied, according to exemplary embodiments, and after the first conductivity-type semiconductor core 142 of gallium nitride (GaN) is grown, at least one source among aluminum (Al) and indium (In) may be additionally supplied in-situ to form a layer formed of aluminum indium gallium nitride having a composition of $Al_xIn_yGa_{1-x-y}N$ ($0 \le x<1$, $0 \le y<1$, $0 \le x+y<1$).

In the semiconductor light emitting device 100b according to the present exemplary embodiment, by forming the mask layer 130 and the highly resistive layer 143 including a heterogeneous interface, a leakage current may be effectively blocked in both upper and lower portions of the light emitting nanostructures 140b.

Figure 9:
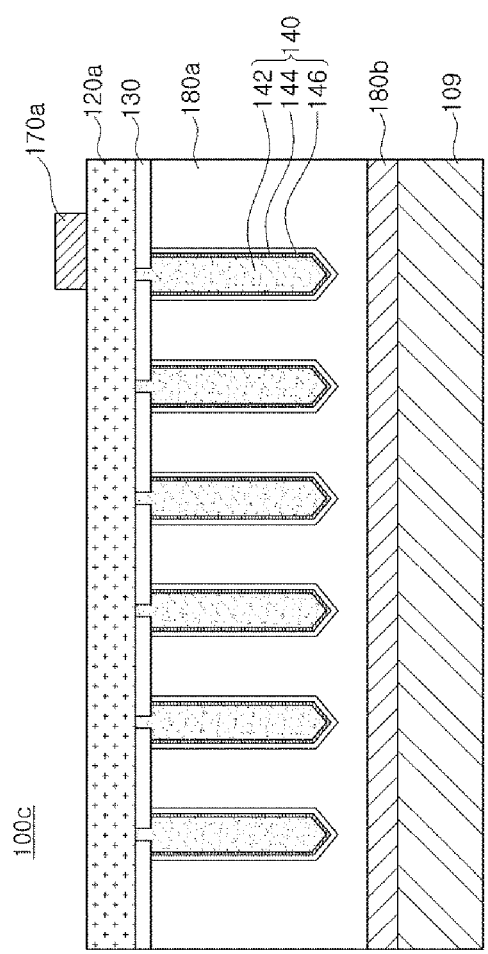
FIG. 9 is a cross-sectional view schematically illustrating a semiconductor light emitting device according to an exemplary embodiment of the present invention.

FIG. 9 is a cross-sectional view schematically illustrating a semiconductor light emitting device according to an exemplary embodiment of the present invention.

Referring to FIG. 9, a semiconductor light emitting device 100c includes a conductive substrate 109, a base layer 120a, a mask layer 130, and light emitting nanostructures 140. Each of the light emitting nanostructures 140 includes a first conductivity-type semiconductor core 142, an active layer 144, and a second conductivity-type semiconductor layer 146 grown on the base layer 120a. The semiconductor light emitting device 100c may further include a first electrode 170a and second electrodes 180a and 180b electrically connected to the base layer 120a and the second conductivity-type semiconductor layer 146, respectively.

Although not shown in detail in FIG. 9, the first conductivity-type semiconductor core 142 may include first to fourth regions 142A, 142B, 142C, and 142D, or first and second regions 142A' and 142B', as illustrated in FIG. 1 or FIG. 4.

The conductive substrate 109 may be formed of a conductive material and may be, for example, a silicon (Si) substrate or a Si—Al alloy substrate.

The second electrodes 180a and 180b may include a contact electrode layer 180a and a bonding electrode layer 180b. The conductive substrate 109 may be electrically connected to the contact electrode layer 180a by the medium of the bonding electrode layer 180b. According to an exemplary embodiment, as illustrated in FIG. 1, the transparent electrode 150 covering the light emitting nanostructures 140 may be further disposed.

The contact electrode layer 180a may include a material appropriate for realizing ohmic-contact with the second conductivity-type semiconductor layer 146 of the light emitting nanostructures 140. The contact electrode layer 180a may be formed of, for example, gallium nitride (GaN), indium gallium nitride (InGaN), zinc oxide (ZnO), or a graphene layer. Also, the contact electrode layer 180a may include a material such as silver (Ag), nickel (Ni), aluminum (Al), rhodium (Rh), palladium (Pd), iridium (Ir), ruthenium (Ru), magnesium (Mg), zinc (Zn), platinum (Pt), gold (Au), or the like, and may have a structure including two or more layers such as nickel/silver (Ni/Ag), zinc/silver (Zn/Ag), nickel/aluminum (Ni/Al), zinc/aluminum (Zn/Al), palladium/silver (Pd/Ag), palladium/aluminum (Pd/Al), iridium/silver (Ir/Ag), iridium/gold (Ir/Au), palladium/silver (Pt/Ag), palladium/aluminum (Pt/Al), nickel/silver/platinum (Ni/Ag/Pt), or the like. In particular, the contact electrode layer 180a may be formed as a reflective metal layer in consideration of light extraction efficiency. In this case, the contact electrode layer 180a may upwardly reflect light emitted from the active layer 144 and traveling toward the conductive substrate 109. The bonding electrode layer 180b may be, for example, a eutectic metal layer such as nickel/tin (Ni/Sn).

The semiconductor light emitting device 100c according to the present exemplary embodiment may be manufactured by a process of forming the contact electrode layer 180a, instead of the filler layer 160, and forming the bonding electrode layer 180b on the contact electrode layer 180a during the process as described above with reference to FIG. 2I. Thereafter, the conductive substrate 109 is bonded to the contact electrode layer 180a, and the substrate 101 (refer to FIG. 1), a growth substrate of semiconductor layers, may be removed by detaching it from the base layer 120a. The base layer 120a according to the present exemplary embodiment may not have a depression and protrusion pattern such as that of the semiconductor light emitting device 100 of FIG. 1, but the present inventive concept is not limited thereto.

Figure 10:
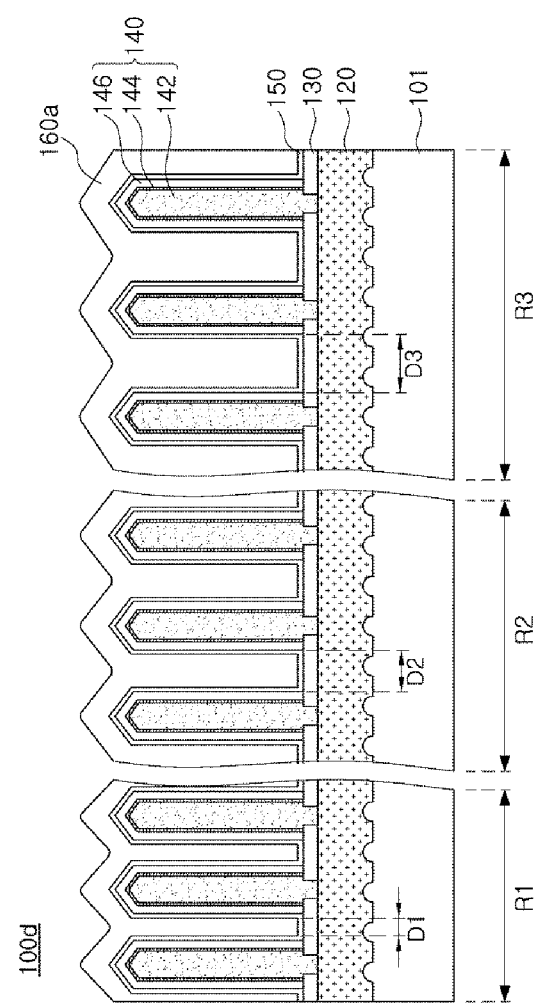
FIG. 10 is a cross-sectional view schematically illustrating a semiconductor light emitting device according to an exemplary embodiment of the present invention.

FIG. 10 is a cross-sectional view schematically illustrating a semiconductor light emitting device according to an exemplary embodiment of the present invention.

Referring to FIG. 10, a semiconductor light emitting device 100d includes a substrate 101, and a base layer 120, a mask layer 130, light emitting nanostructures 140, a transparent electrode layer 150, and a filler layer 160a formed on the substrate 101. Each of the light emitting nanostructures 140 includes a first conductivity-type semiconductor core 142, an active layer 144, and a second conductivity-type semiconductor layer 146 grown from the base layer 120. In FIG. 10, partial components, for example, first and second electrodes 170 and 180, of the semiconductor light emitting device 100d are omitted.

Although not shown in detail in FIG. 10, the first conductivity-type semiconductor core 142 may include first to fourth regions 142A, 142B, 142C, and 142D, or may include first and second regions 142A' and 142B' illustrated in FIG. 1 or FIG. 4.

Also, the filler layer 160a may have an uneven upper surface according to the shape of the light emitting nanostructures 140.

The semiconductor light emitting device 100d according to the present exemplary embodiment may include first to third regions R1, R2, and R3, and the light emitting nanostructures 140 in the first to third regions are spaced apart from one another by distances D1, D2, and D3, respectively. Here, the first distance D1 is shortest, and the third distance D3 may be largest.

In the case in which the semiconductor light emitting device 100d includes the first to third regions R1, R2, and R3 in which the distances between the light emitting nanostructures 140 are different, the content of indium (In) or growth thicknesses of the active layer 144 of the light emitting nanostructures 140 grown in the regions may be different. For example, in a case in which the light emitting nanostructures 140 are grown under the same growth conditions, as the distance between the light emitting nanostructures 140 is greater, the content of indium (In) of the active layer 144 may increase and a growth thickness may be greater. Thus, the light emitting nanostructures 140 in the first to third regions R1, R2, and R3 may emit light having different wavelengths, and white light may be emitted by mixing the light having different wavelengths.

According to exemplary embodiments, the light emitting nanostructures 140 may be formed to have different sizes in the first to third regions R1, R2, and R3.

Figure 11:
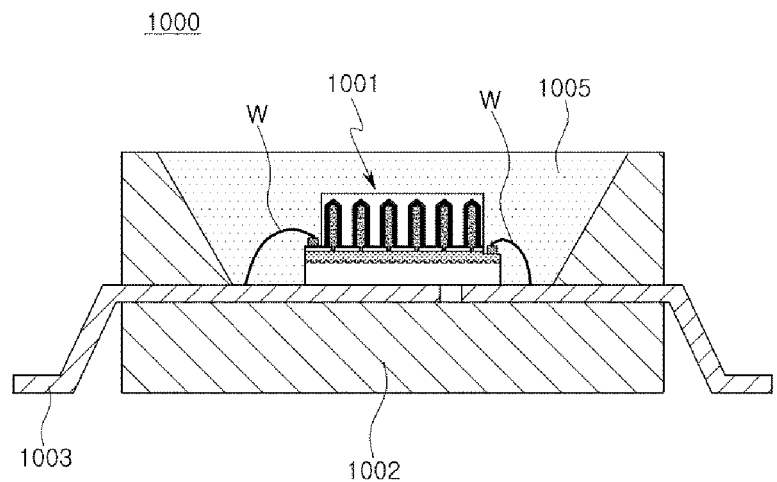
FIGS. 11 and 12 are views illustrating examples of packages employing a semiconductor light emitting device according to an exemplary embodiment of the present invention.
Figure 12:
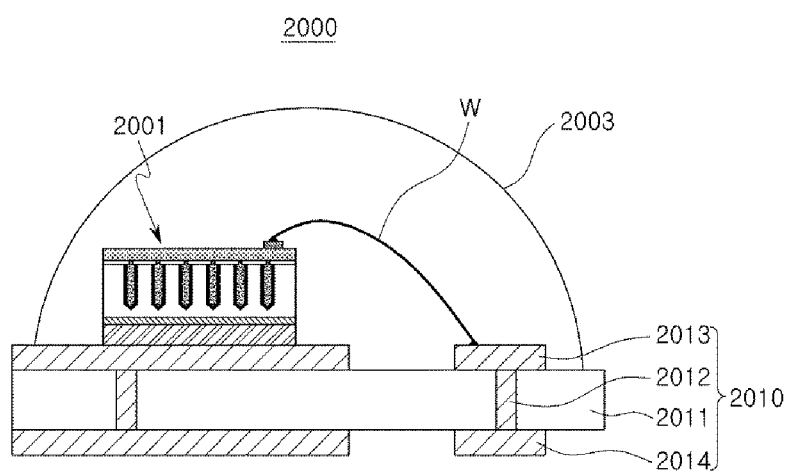

FIGS. 11 and 12 are views illustrating examples of packages employing a semiconductor light emitting device according to an exemplary embodiment of the present invention.

Referring to FIG. 11, a semiconductor light emitting device package 1000 may include a semiconductor light emitting device 1001, a package body 1002, and a pair of lead frames 1003. The semiconductor light emitting device 1001 may be mounted on the lead frames 1003 and electrically connected to the lead frames 1003 through wires W. According to an exemplary embodiment, the semiconductor light emitting device 1001 may also be mounted on a different region, for example, on the package body 1002, rather than on the lead frames 1003. The package body 1002 may have a cup shape to improve reflectivity efficiency of light. An encapsulant 1005 formed of a light-transmissive material may be formed in the reflective cup to encapsulate the semiconductor light emitting device 1001, the wires W, and the like.

In the present exemplary embodiment, the semiconductor light emitting device package 1000 is illustrated as including the semiconductor light emitting device 1001 having a structure similar to that of the semiconductor light emitting device 100 illustrated in FIG. 1, but it may also include the semiconductor light emitting device 100a, 100b, 100c, or 100d according to another exemplary embodiment of the present invention as described above with reference to FIGS. 4, 8, 9, and 10.

Referring to FIG. 12, a semiconductor light emitting device package 2000 may include a semiconductor light emitting device 2001, a mounting board 2010, and an encapsulant 2003. The semiconductor light emitting device 2001 may be mounted on the mounting board 2010 and electrically connected to the mounting board 2010 through a wire W and the conductive substrate 109 (refer to FIG. 9).

The mounting board 2010 may include a board body 2011, an upper electrode 2013, and a lower electrode 1014. Also, the mounting board 2010 may include a through electrode 2012 connecting the upper electrode 2013 and the lower electrode 2014. The mounting board 2010 may be provided as a board such as PCB, MCPCB, MPCB, FPCB, or the like, and the structure of the mounting board 2010 may be applied to have various forms.

The encapsulant 2003 may be formed to have a lens structure with an upper surface having a convex dome shape. However, according to an exemplary embodiment, the encapsulant 2003 may have a lens structure having a convex or concave surface to adjust a beam angle of light emitted through an upper surface of the encapsulant 2003.

In the present exemplary embodiment, the semiconductor light emitting device package 2000 is illustrated as including the semiconductor light emitting device 2001 having a structure identical to that of the semiconductor light emitting device 100c illustrated in FIG. 9, but, according to an exemplary embodiment, it may also include the semiconductor light emitting device 100, 100a, 100b, or 100d according to other exemplary embodiment of the present invention described above with reference to FIGS. 1, 4, 8, and 10.

Figure 13:
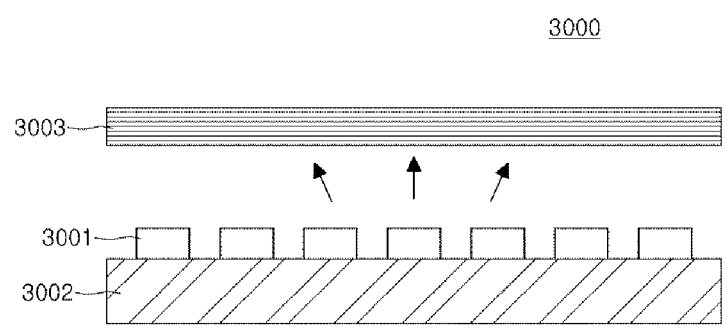
FIGS. 13 and 14 are examples of backlight units employing a semiconductor light emitting device according to an exemplary embodiment of the present invention.
Figure 14:
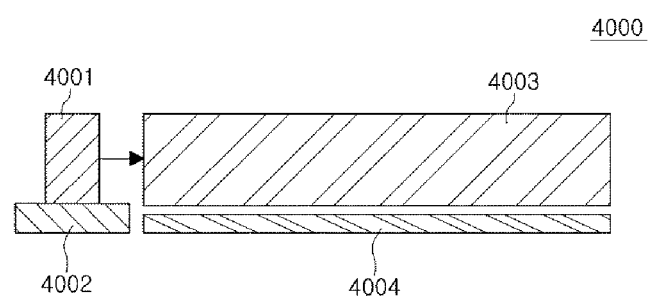

FIGS. 13 and 14 are examples of backlight units employing a semiconductor light emitting device according to an exemplary embodiment of the present invention.

Referring to FIG. 13, a backlight unit 3000 includes light sources 3001 mounted on a substrate 3002 and one or more optical sheets 3003 disposed above the light sources 3001. The semiconductor light emitting device package having the structure described above with reference to FIGS. 11 and 12 or a structure similar thereto may be used as the light sources 3001. Alternatively, a semiconductor light emitting device may directly be mounted on the substrate 3002 (a so-called COB type) and used.

Unlike the backlight unit 3000 in FIG. 13 in which the light sources 3001 emit light toward an upper side where a liquid crystal display is disposed, a backlight unit 4000 as another example illustrated in FIG. 14 is configured such that a light source 4001 mounted on a substrate 4002 emits light in a lateral direction, and the emitted light may be made to be incident to a light guide plate 4003 so as to be converted into a surface light source. Light, passing through the light guide plate 4003, is emitted upwards, and in order to enhance light extraction efficiency, a reflective layer 4004 may be disposed on a lower surface of the light guide plate 4003.

Figure 15:
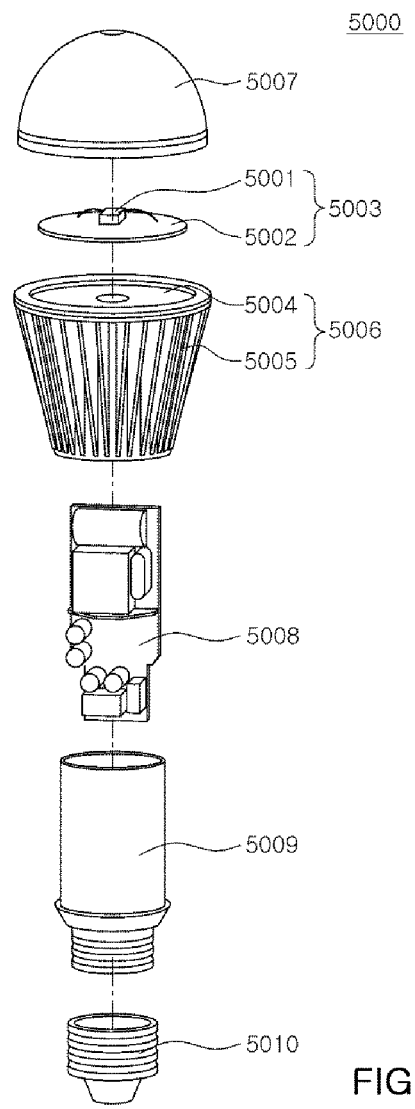
FIG. 15 is a view illustrating an example of a lighting device employing a semiconductor light emitting device according to an exemplary embodiment of the present invention.

FIG. 15 is a view illustrating an example of a lighting device employing a semiconductor light emitting device according to an exemplary embodiment of the present invention.

Referring to the exploded perspective view of FIG. 15, a lighting device 5000 is illustrated as, for example, a bulb-type lamp and includes a light emitting module 5003, a driving unit 5008, and an external connection unit 5010. The lighting device 5000 may further include external structures such as external and internal housings 5006 and 5009 and a cover unit 5007. The light emitting module 5003 may include a semiconductor light emitting device 5001 having a structure identical or similar to that of the semiconductor light emitting device 100, 100a, 100b, 100c, or 100d described above with reference to FIGS. 1, 4, 8, 9, and 10 and a circuit board 5002 having the semiconductor light emitting device 5001 mounted thereon. In the present exemplary embodiment, it is illustrated that a single semiconductor light emitting device 5001 is mounted on the circuit board 5002, but a plurality of semiconductor light emitting devices may be installed as needed. Also, the semiconductor light emitting device 5001 may be manufactured as a package and subsequently mounted, rather than being directly mounted on the circuit board 5002.

The external housing 5006 may serve as a heat dissipation unit and may include a heat dissipation plate 5004 disposed to be in direct contact with the light emitting module 5003 to enhance heat dissipation and heat dissipation fins 5005 surrounding the lateral surfaces of the lighting device 5000. The cover unit 5007 may be installed on the light emitting module 5003 and have a convex lens shape. The driving unit 5008 may be installed in the internal housing 5009 and connected to the external connection unit 5010 having a socket structure to receive power from an external power source. Also, the driving unit 5008 may serve to convert power into an appropriate current source for driving the semiconductor light emitting device 5001 of the light emitting module 5003, and provide the same. For example, the driving unit 5008 may be configured as an AC-DC converter, a rectifying circuit component, or the like.

Also, although not shown, the lighting device 5000 may further include a communications module.

Figure 16:
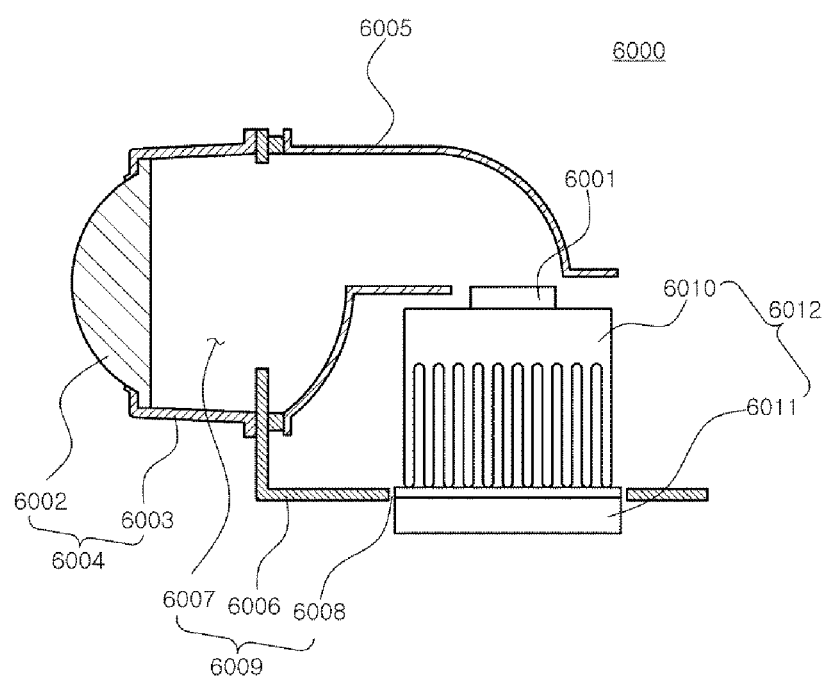
FIG. 16 is a view illustrating an example of a headlamp employing a semiconductor light emitting device according to an exemplary embodiment of the present invention.

FIG. 16 is a view illustrating an example of a headlamp employing a semiconductor light emitting device according to an exemplary embodiment of the present invention.

Referring to FIG. 16, a headlamp 6000 used as a vehicle lamp, or the like, may include a light source 6001, a reflective unit 6005, and a lens cover unit 6004. The lens cover unit 6004 may include a hollow guide 6003 and a lens 6002. The light source 6001 may include at least one of semiconductor light emitting device packages of FIGS. 11 and 12. The headlamp 6000 may further include a heat dissipation unit 6012 outwardly dissipating heat generated by the light source 6001. In order to effectively dissipate heat, the heat dissipation unit 6012 may include a heat sink 6010 and a cooling fan 6011. Also, the headlamp 6000 may further include a housing 6009 fixedly supporting the heat dissipation unit 6012 and the reflective unit 6005, and the housing 6009 may have a body unit 6006 and a central hole 6008 formed in one surface thereof, in which the heat dissipation unit 6012 is coupled. Also, the housing 6009 may have a front hole 6007 formed in the other surface integrally connected to the one surface and bent in a right angle direction. The reflective unit 6005 is fixed to the housing 6009 such that light generated by the light source 6001 is reflected thereby to pass through the front hole 6007 so as to be output outwardly.

As set forth above, according to exemplary embodiments of the present invention, a semiconductor light emitting device having improved variations of light emission wavelength and enhanced luminous efficiency by enhancing centering in forming light emitting nanostructures may be provided.

Advantages and effects of the present inventive concept are not limited to the foregoing content and may be easily understood from the described specific exemplary embodiments of the present inventive concept.

While exemplary embodiments have been shown and described above, it will be apparent to those skilled in the art that modifications and variations could be made without departing from the scope of the present invention as defined by the appended claims.

What is claimed is:

1. A method for manufacturing a semiconductor light emitting device, the method comprising:
    forming a base layer with a first conductivity-type semiconductor on a substrate;
    forming a mask layer and a mold layer having a plurality of openings exposing portions of the base layer on the base layer;
    forming a plurality of first conductivity-type semiconductor cores each including a body portion extending through each of the openings from the base layer and a tip portion disposed on the body portion and having a conical shape; and
    sequentially forming an active layer and a second conductivity-type semiconductor layer on each of the plurality of first conductivity-type semiconductor cores,
    wherein forming the plurality of first conductivity-type semiconductor cores comprises:
        forming, a first region such that a vertex of the tip portion is positioned on a central vertical axis of the body portion;
        removing the mold layer;
        forming an additional growth region on the first region such that the body portion has a hexagonal prism shape, wherein forming the additional growth region comprises growing a plurality of first conductivity-type semiconductor cores under a hydrogen ($H_2$) atmosphere; and
        growing the plurality of first conductivity-type semiconductor cores under a nitrogen ($N_2$) atmosphere, before and after growing the plurality of first conductivity-type semiconductor cores under the hydrogen ($H_2$) atmosphere.

2. A method for manufacturing a semiconductor light emitting device, the method comprising step of:
    forming a base layer with a first conductivity-type semiconductor on a substrate;
    forming a mask layer and a mold layer having a plurality of openings exposing portions of the base layer on the base layer;
    forming a plurality of first conductivity-type semiconductor cores each including a body portion extending through each of the openings from the base layer and a tip portion disposed on the both portion and having a conical shape; and sequentially forming an active layer and a second conductivity-type semiconductor layer on each of the plurality of first conductivity-type semiconductor cores,
wherein the step of forming the plurality of first conductivity-type semiconductor cores comprises:
forming a first region such that a vertex of the tip portion is positioned on a central vertical axis of the body portion; wherein the first region of the body portion has sloped lateral surfaces such that an upper portion thereof has a larger width;
removing the mold layer after forming the first region; and
forming an additional growth region on the first region such that the body portion has a hexagonal prism shape after removing the mold layer.

3. The method of claim 2, wherein forming the additional growth region includes the body portion mainly growing from a lower portion of the body portion to allow the body portion to be substantially perpendicular with respect to the substrate.

4. The method of claim 1, wherein the plurality of first conductivity-type semiconductor cores are formed of a gallium nitride (GaN)-based material, and in the forming of the first region, a ratio of a supplied gallium (Ga) precursor to a nitrogen (N) precursor ranges from 1.4 to 2.0 and a process temperature ranges from 900° C. to 1000° C.

5. The method of claim 1, wherein the first region fills each opening and extends to an upper portion of the mold layer to have a width greater than a width of each opening on the mold layer.

6. The method of claim 1, wherein the additional growth region includes a second region formed on the first region and grown under the nitrogen ($N_2$) atmosphere, a third region positioned on the second region and grown under hydrogen ($H_2$) atmosphere, and a fourth region positioned on the third region and grown under the nitrogen ($N_2$) atmosphere, and the third region is thicker in a lower portion of the body portion than in an upper portion of the body portion.

7. The method of claim 6, wherein an impurity concentration of the third region is higher than impurity concentrations of the second and fourth regions.

8. The method of claim 6, wherein an amount of an impurity source supplied to form the third region is five times to seven times an amount of an impurity source supplied to form the second and fourth regions.

9. The method of claim 1, wherein a percentage by which a vertex of the tip portion is disposed within a distance equal to 1.5% of the with of the body portion from a central vertical axis of the body portion is 60% or greater.

* * * * *